US00RE45924E

(19) United States
(12) Reissued Patent
Oda et al.

(10) Patent Number: US RE45,924 E
(45) Date of Reissued Patent: Mar. 15, 2016

(54) ELECTRIC CONTACT AND SOCKET FOR ELECTRICAL PART

(71) Applicant: ENPLAS CORPORATION, Saitama (JP)

(72) Inventors: Takahiro Oda, Saitama (JP); Kentaro Hayakawa, Kawaguchi (JP); Takashi Morinari, Saitama (JP)

(73) Assignee: ENPLAS CORPORATION, Saitama (JP)

(21) Appl. No.: 13/965,494

(22) Filed: Aug. 13, 2013

Related U.S. Patent Documents

Reissue of:
(64) Patent No.: 8,016,624
Issued: Sep. 13, 2011
Appl. No.: 11/719,465
PCT Filed: Sep. 22, 2006
PCT No.: PCT/JP2006/318870
§ 371 (c)(1),
(2) Date: May 16, 2007
PCT Pub. No.: WO2007/034921
PCT Pub. Date: Mar. 29, 2007

(30) Foreign Application Priority Data

Sep. 22, 2005 (JP) ..... 2005-276562
Sep. 27, 2005 (JP) ..... 2005-279165
Aug. 2, 2006 (JP) ..... 2006-210663

(51) Int. Cl.

| | |
|---|---|
| ***G01R 1/067*** | (2006.01) |
| ***H01R 13/03*** | (2006.01) |
| ***C25D 5/12*** | (2006.01) |
| ***C25D 5/50*** | (2006.01) |
| ***C25D 7/00*** | (2006.01) |
| ***G01R 1/04*** | (2006.01) |

(52) U.S. Cl.
CPC .. *C25D 5/12* (2013.01); *C25D 5/50* (2013.01); *C25D 7/00* (2013.01); *G01R 1/0466* (2013.01); *G01R 1/06738* (2013.01); *G01R 1/06755* (2013.01); *H01R 13/03* (2013.01)

(58) Field of Classification Search
CPC ..... G01R 1/06; G01R 1/0408; G01R 1/0416; G01R 1/0433; G01R 1/0441; G01R 1/0483; G01R 31/26; H01L 23/49582; H01R 13/03; C25D 3/567; C25D 3/50; C25D 3/64; C25D 3/46
See application file for complete search history.

(56) References Cited

U.S. PATENT DOCUMENTS

| | | | | |
|---|---|---|---|---|
| 4,269,671 | A * | 5/1981 | Cohen et al. | 428/670 |
| 4,529,667 | A * | 7/1985 | Shiga et al. | 428/646 |
| 5,684,329 | A * | 11/1997 | Serizawa | 257/677 |
| 6,521,358 | B1 * | 2/2003 | Tanaka et al. | 428/670 |
| 8,016,624 | B2 | 9/2011 | Oda et al. | |
| 2005/0006976 | A1 * | 1/2005 | Someya et al. | 310/251 |
| 2005/0145997 | A1 * | 7/2005 | Buresch | 257/666 |
| 2005/0233566 | A1 * | 10/2005 | Paek et al. | 438/611 |
| 2010/0163276 | A1 * | 7/2010 | Yamaguchi et al. | 174/126.2 |
| 2010/0186993 | A1 * | 7/2010 | Yamaguchi et al. | 174/126.2 |

FOREIGN PATENT DOCUMENTS

| | | | |
|---|---|---|---|
| EP | 132596 | | 2/1985 |
| EP | 132596 | A * | 2/1985 |

(Continued)

OTHER PUBLICATIONS

Translation of JP 11/111909. Apr. 1999.*

(Continued)

*Primary Examiner* — Sean E Vincent
(74) *Attorney, Agent, or Firm* — Staas & Halsey LLP

(57) ABSTRACT

A contact pin includes a base material composed of a material having a conductive property and an outermost surface layer made of a material into which Sn is dissolved and diffused by applying heat.

19 Claims, 41 Drawing Sheets

(56) References Cited

FOREIGN PATENT DOCUMENTS

| | | | | |
|---|---|---|---|---|
| EP | 136713 | | | 10/1985 |
| EP | 136713 | A2 | * | 10/1985 |
| EP | 474499 | | * | 3/1992 |
| JP | 63-304654 | | * | 12/1988 |
| JP | 5-41425 | | | 2/1993 |
| JP | 5-117898 | | * | 5/1993 |
| JP | 8-148630 | | * | 6/1996 |
| JP | 8-153843 | | * | 6/1996 |
| JP | 9-232057 | | | 9/1997 |
| JP | 9-275182 | | | 10/1997 |
| JP | 10-38918 | | | 2/1998 |
| JP | 11-008340 | | * | 1/1999 |
| JP | 11-111909 | | * | 4/1999 |
| JP | 2000-252402 | | | 9/2000 |
| JP | 2000-286542 | | * | 10/2000 |
| JP | 2000-348793 | | | 12/2000 |
| JP | 2001-56347 | | | 2/2001 |
| JP | 2002-298966 | | | 10/2002 |
| JP | 2003-149267 | | | 5/2003 |
| JP | 2004-93355 | | | 3/2004 |
| JP | 2004-245669 | | | 9/2004 |
| JP | 5334416 | B2 | | 11/2013 |
| WO | 03/027689 | | | 4/2003 |

OTHER PUBLICATIONS

Japanese Office Action issued May 8, 2012 in corresponding Japanese Application No. 2007-536579.

Japanese Office Action issued Nov. 20, 2012 in corresponding Japanese Application No. 2007-536579.

Japanese Office Action issued Jul. 23, 2013 in corresponding Japanese Application No. 2012-154077.

Issue Notification mailed Aug. 24, 2011 in U.S. Appl. No. 11/719,465.

Notice of Allowance mailed May 25, 2011 in U.S. Appl. No. 11/719,465.

Office Action mailed Mar. 1, 2011 in U.S. Appl. No. 11/719,465.

Office Action mailed Feb. 7, 2011 in U.S. Appl. No. 11/719,465.

Office Action mailed Nov. 18, 2010 in U.S. Appl. No. 11/719,465.

Office Action mailed Jun. 9, 2010 in U.S. Appl. No. 11/719,465.

Office Action mailed Mar. 15, 2010 in U.S. Appl. No. 11/719,465.

Notice of Acceptance of Application mailed Mar. 5, 2008 in U.S. Appl. No. 11/719,465.

Notification of Submission of Information dated Dec. 11, 2013 in corresponding Japanese Patent Application No. 2012-154077.

Japanese Office Action dispatched Apr. 30, 2014 in corresponding Japanese Patent Application No. 2012-154077.

Japanese Office Action dispatched Apr. 15, 2014 in corresponding Japanese Patent Application No. 2012-154077.

Japanese Office Action dispatched Jul. 1, 2014 in corresponding Japanese Patent Application No. 2012-154077.

Abstract for DD 283236 A. Published Oct. 1990.*

Patent Abstract of Japan, Publication No. 2005-504962, Published Feb. 17, 2005.

International Search Report of the International Application No. PCT/JP2006/318870 (mailed Jan. 9, 2007).

International Preliminary Report on Patentability, mailed Apr. 3, 2008 and issued in corresponding International Patent Application No. PCT/JP2006/318870.

* cited by examiner

FIG.4A
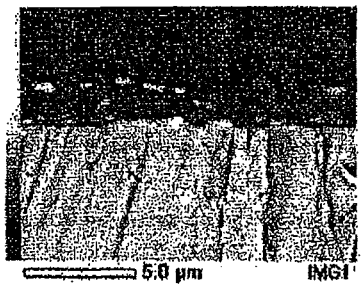
FIG.4B Au
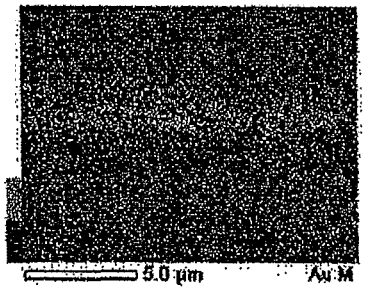
FIG.4C Sn
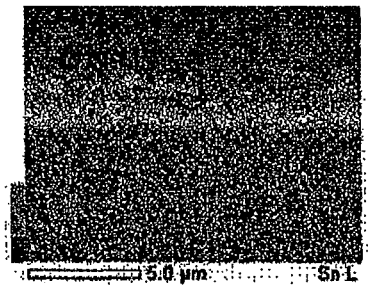
FIG.4D Ni
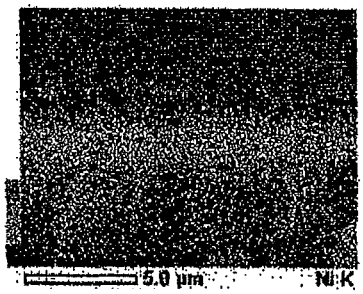

FIG.5A
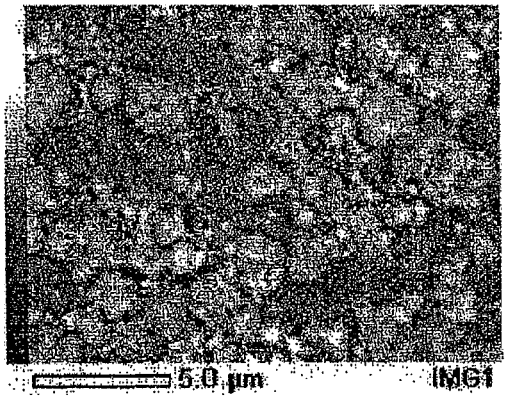
FIG.5B Ni
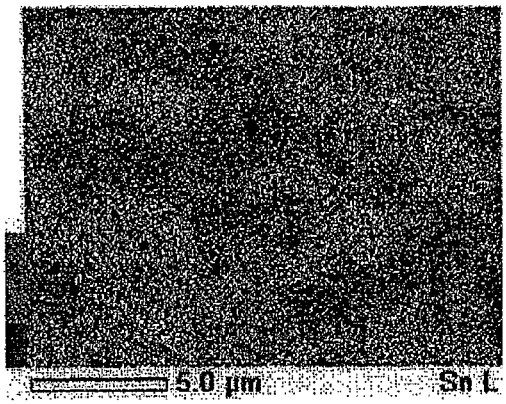
FIG.5C Sn
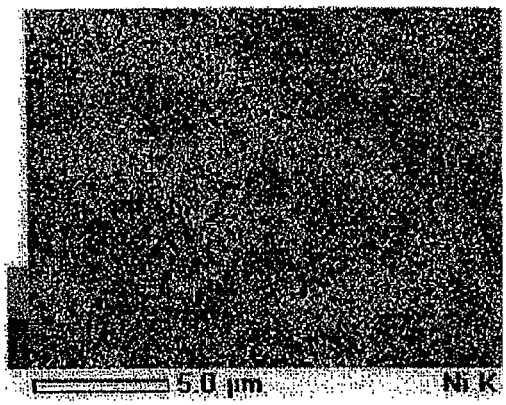

FIG.7A
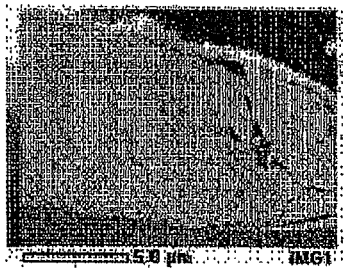
FIG.7B Ag
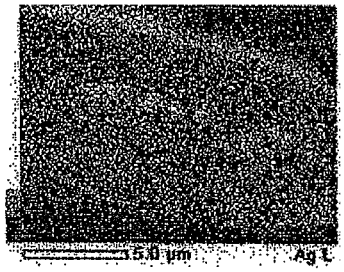
FIG.7C Pd
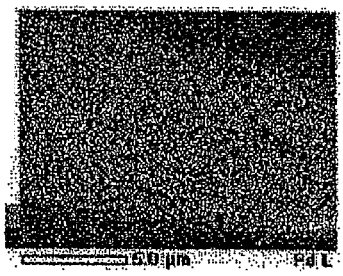
FIG.7D Sn
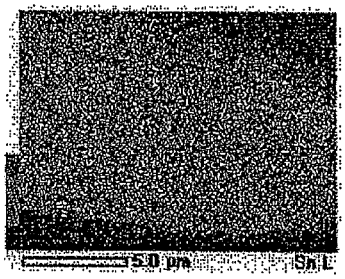
FIG.7E Ni
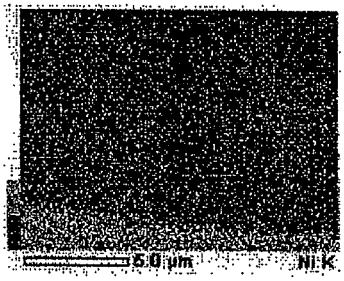

FIG.9A
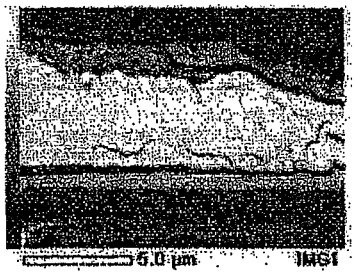
FIG.9B Ag
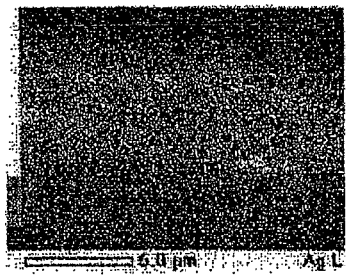
FIG.9C Pd
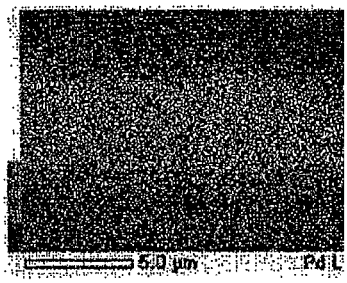
FIG.9D Sn
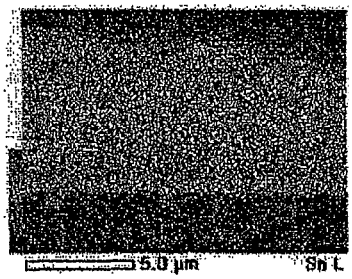
FIG.9E Ni
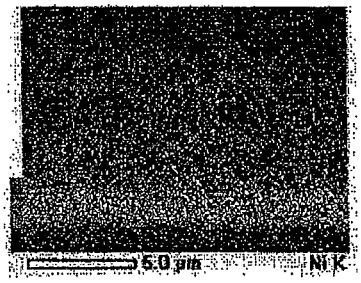

FIG.18A COMPO image
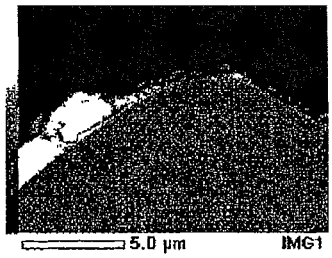
FIG.18B Au
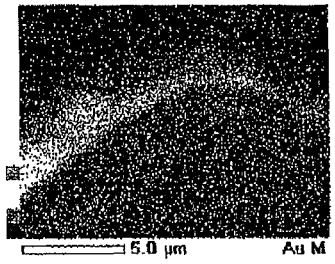
FIG.18C Sn
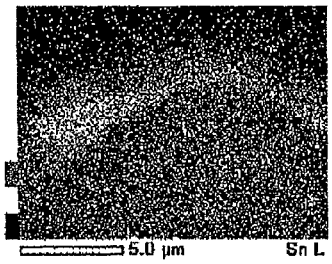
FIG.18D Ni
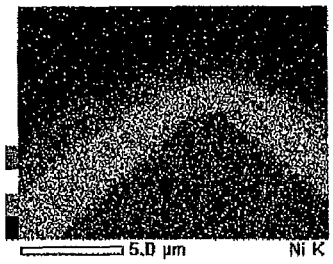

FIG.20A COMPO image
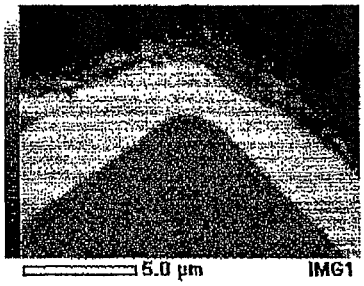
FIG.20B Ag
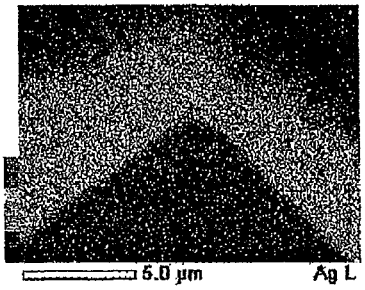
FIG.20C Sn
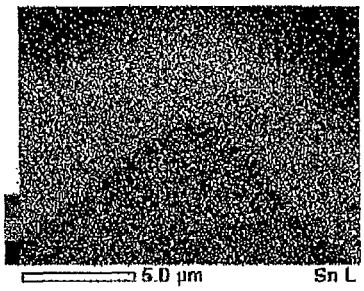
FIG.20D Ni
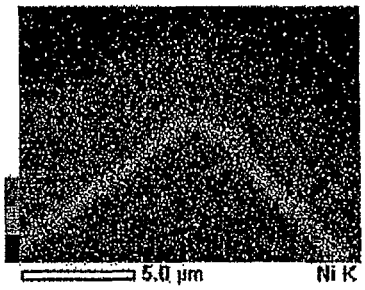

FIG.24A
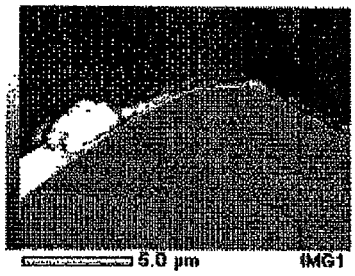
FIG.24B Au
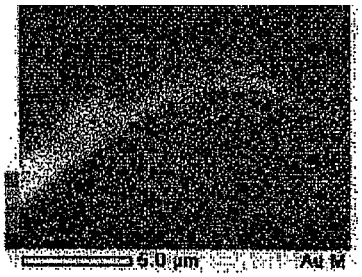
FIG.24C Sn
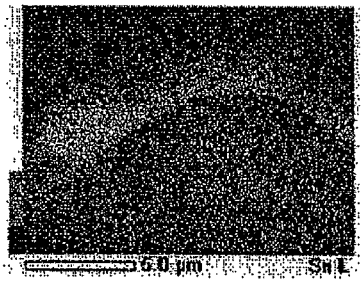
FIG.24D Ni
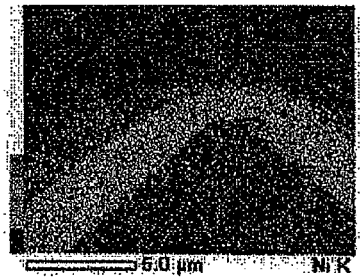

FIG.26A
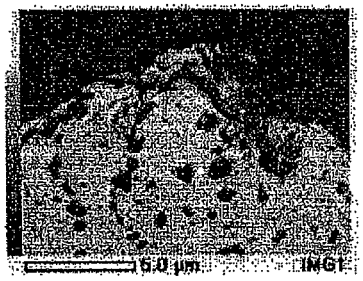
FIG.26B Ag
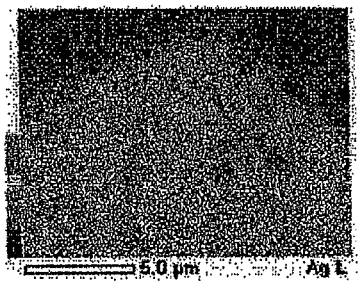
FIG.26C Zn
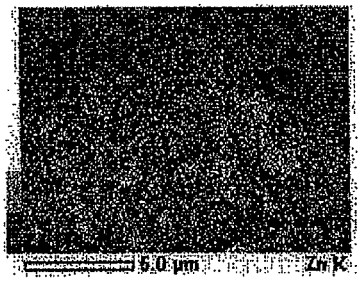
FIG.26D Sn
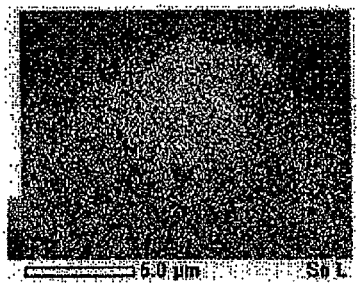

Ag

Sn

FIG.30A COMPO image
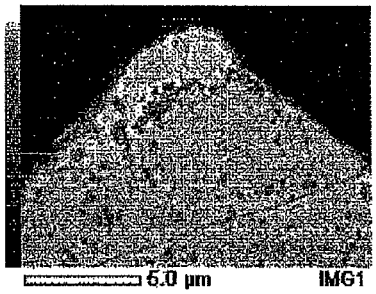
FIG.30B Ag
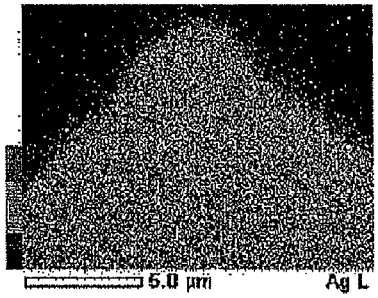
FIG.30C Sn
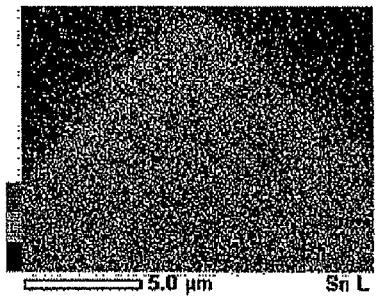

FIG.32A
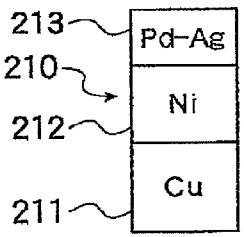
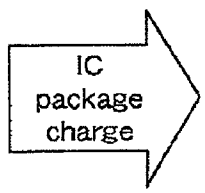
FIG.32B
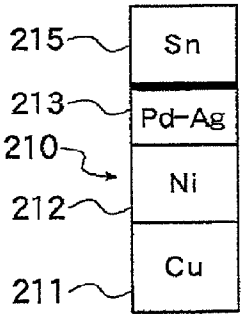
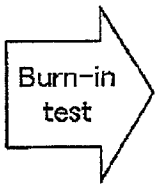
FIG.32C
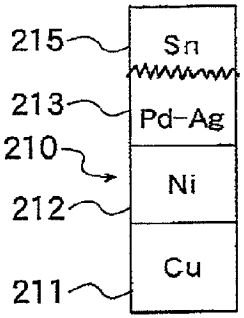
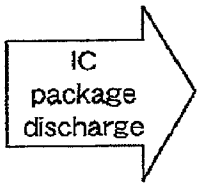
FIG.32D
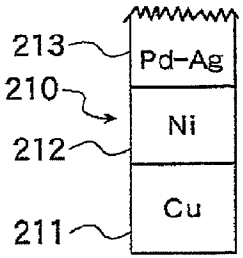

FIG.40A
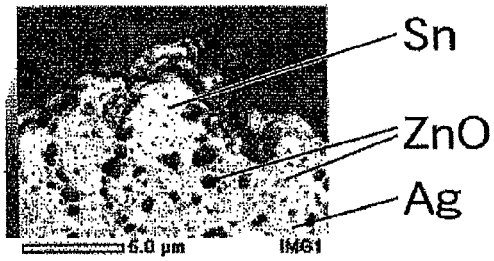
FIG.40B Ag
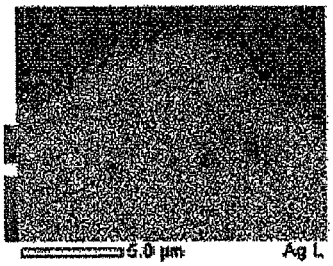
FIG.40C ZnO
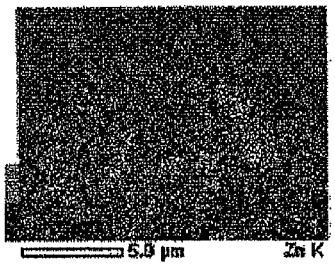
FIG.40D Sn
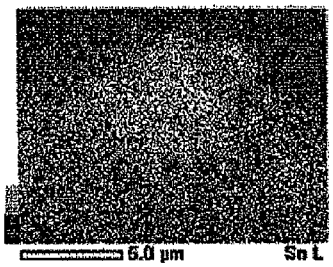

ELECTRIC CONTACT AND SOCKET FOR ELECTRICAL PART

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS REFERENCE TO RELATED APPLICATION

[This application] *This application is a reissue of U.S. application Ser. No. 11/719,465, issued as U.S. Pat. No. 8,016,624, on Sep. 13, 2011, which* is based on and claims priority to International Application No. PCT/JP2006/318870 filed Sep. 22, 2006, and Japanese Application No.(s) 2005-276562 filed Sep. 22, 2005, 2005-279165 filed Sep. 27, 2005, and 2006-210663 filed Aug. 2, 2006, the disclosures of which are hereby incorporated herein by reference.

TECHNICAL FIELD

The present invention relates to an electric contact to be electrically connected to an electrical part such as semiconductor device (called "IC package", hereinafter) and a socket for an electrical part provided with such electric contact.

BACKGROUND ART

Conventionally, as an electric contact of the type mentioned above, there is known a contact pin provided for an IC socket as a socket for an electrical part. This IC socket is disposed on a circuit board and accommodated with an IC package as an object to be inspected, and a terminal of this IC package and an electrode of the circuit board are electrically connected through the contact pin.

The contact pin has an outermost Au plated layer (added with extremely small amount of Co) and a base layer made of Ni. On the other hand, the terminal of the IC package is made of Sn (tin) as main component including no lead, so-called lead-free solder. According to the contact of the contact pin and the terminal, they are connected electrically, which are then provided for a burn-in test.

As such kind of electric contact, there is disclosed in Patent Publication 1 (Japanese Patent Publication No. 2005-504962 A)

DISCLOSURE OF THE INVENTION

Problems to be Solved by the Invention

In such conventional one, however, there was a case in which repeated burn-in test makes large an electric resistance in an early stage, resulting in difficulty for performing an appropriate test. By increasing a contacting load between the IC package terminal and the contact pin, the increasing of the electric resistance can be suppressed by some extent, but there is a restriction on increasing the contact load and there is hence a limit on suppressing the increasing of the electric resistance.

Then, an object of the present invention is to provide an electric contact and a socket for an electrical part capable of suppressing the increasing of the electric resistance and performing an appropriate burn-in test even if the test is carried out repeatedly.

Means for Solving the Problem

In order to solve the above problems, the inventors of the subject application studied and found the following matters. That is, in a conventional technology, since the outermost surface layer of the contact pin is formed of an Au plating layer and the base layer is made of Ni, when the burn-in test with respect to an IC package having a lead free solder terminal is repeatedly carried out, the Au is dissolved in the terminal side, and then, the Au plating layer is vanished. Finally Ni of the base layer is exposed. Then, the Ni is oxidized in air and an oxide film having a large specific resistance is formed. As a result, it was found that the electric resistance at the contact portion of the contact pin to the terminal becomes high.

From the above fact, the inventors of the subject application considered that, in order to prevent the outermost surface layer of the electric contact side from being dissolved into the terminal side of the electrical part and to prevent Ni of the base layer from being exposed, Sn in the solder of the terminal of the electrical part is transferred to the electric contact side during the burn-in (high temperature) test, and the Sn is diffused into the outermost surface layer and hardly stored as an oxide thereof. According to this matter, even if the burn-in test is repeatedly performed, the electric resistance is not increased in an early stage.

The electric contact may include a base material having conductive property and an outermost layer comprised of a material into which Sn (tin) is dissolved and diffused by applying heat.

The electric contact may further include a base layer comprised of Ni (nickel) formed between the base material and the outermost surface.

The outermost surface layer may be made of Pd (palladium) and Ag (silver).

The Ag may have a weight larger than that of the Pd.

The outermost surface layer may include a Pd—Ag plating layer.

The outermost surface layer may be a lamination of a Pd—Ag plating layer and an Ag plating layer or a Pd plating layer.

The outermost surface layer may be a lamination of an Ag plating layer and a Pd plating layer.

The outermost surface layer may be a layer comprised of Ag and another metal.

The outermost surface layer may include Ag and Sn.

The outermost surface layer may include Ag and Sn, and a weight % of the Sn is not less than 80% with respect to the Sn.

In an electric contact which is electrically connected to a terminal of an electrical part in contact therewith, a contact portion contacting at least the terminal is formed of a composite material of Ag-an oxide of metal element, into which Sn (tin) is dissolved and diffused by applying heat.

The composite material may be made of Ag—ZnO.

The Ag may have a weight % of not less than 80% with respect to the ZnO.

The composite material may be made of Ag—$SnO_2$.

The Ag may have a weight % of not less than 80% with respect to the $SnO_2$.

In an electric contact which is electrically connected to a terminal of an electrical part in contact therewith, a contact portion contacting to at least the terminal is formed of a composite material made of Ag, a substance other than metal, into which Sn (tin) is dissolved and diffused by applying heat.

The composite material may be made of Ag—C.

The Ag may have a weight % of not less than 80% with respect to the C.

Furthermore, in the study of the inventors of the subject application, the inventors found the following matters. That is, in a conventional technology, since the outermost surface layer of the contact pin is formed of an Au plating layer and the base layer is made of Ni, in the repeated burn-in test to an IC package having a lead free solder terminal, the Au is dissolved into the terminal side, and then, the Au plating layer is vanished. Finally, the Ni component of the base layer is exposed.

That is, in the burn-in test, the Au on the contact pin side and the Sn of the IC package terminal forms an alloy. Then, after the test, when the device is taken out, almost all part of this alloy is peeled off with the IC package terminal, and therefore, in the repetition of the burn-in test the Au plating layer on the contact pins side is made thin and, finally, Ni of the base layer is exposed.

When Ni of the base layer is exposed, the Ni is oxidized in air and forms an oxide film having a large specific resistance. As a result, it was found that the electric resistance of the contact portion with respect to the terminal of the contact pin becomes high.

Then, from the above fact, the inventors of the subject application found that by making the Sn diffuse into the surface layer of the electric contact and by suppressing the peeling of the surface layer of the electric contact with the terminal of the electric part, an oxide film is hardly formed on the surface layer and the increasing of the electric resistance can be suppressed.

In an electric contact which is electrically connected to a terminal of an electrical part in contact therewith, a contact portion contacting to at least the terminal is provided with a contact material into which Sn (tin) included in a solder is diffused, and the contact material has a tensile strength higher than that of the solder, and an alloy containing both the contact material and the diffused Sn has a tensile strength higher than that of the solder.

The contact material may be formed of a plating layer of Pd(palladium)-Ag(silver) alloy, a lamination of Ag plating layer and Pd—Ag alloy plating layer, a lamination of the Ag plating layer and the Pd plating layer, or an Ag—Sn alloy plating layer.

The contact material may be formed by adding an oxide or organic material to a material into which Sn contained in the solder is hardly diffused therein to thereby enable Sn contained in the solder to be diffused.

The contact material may be a material prepared by adding zinc oxide, carbon or tin oxide to silver.

A socket for an electrical part includes a socket body, an accommodation portion in which an electrical part having a terminal including Sn is accommodated, and an electric contact as described above may be disposed to the socket body so as to contact the terminal.

Effects of the Invention

According to the present invention of the characters mentioned above, the electric contact is composed of a base material made of a material having conductivity and an outermost surface layer composed of a material in which Sn is diffused by applying heat, so that Sn in the solder of the terminal of the electrical part to which the electric contact is contacted under the burn-in test environment is transferred to the outermost surface layer and diffused therein. Accordingly, the component of the outermost surface layer is not dissolved into the terminal side of the electrical part and the base layer is not exposed, and hence, the Sn is hardly stored as an oxide on the surface of the contact portion. As a result, even in a repeated burn-in test, the increasing of the electric resistance of the contact portion of the electric contact in an early stage can be suppressed.

Moreover, according to another invention, the contact portion of the electric contact is made of a composite of Ag-an oxide of metal element or a composite of Ag-a substance other than metal so that the Sn is diffused deeply inside the contact portion and is hardly stored as an oxide on the surface of the contact portion, thereby maintaining the low resistance. Therefore, even if the burn-in test is repeated, the increasing of the electric resistance of the contact portion of the electric contact in an early stage can be effectively suppressed.

Still furthermore, according to a further invention, a contact material in which Sn included in the solder is provided for the contact portion of the electric contact, the Sn is diffused inside the contact portion, and the Sn is hardly accumulated as an oxide on the surface of the contact portion. In addition, this contact material has a tensile strength higher than that of the solder, and the tensile strength of an alloy containing both the contact material and the diffused Sn is also higher than that of the solder, so that when an electrical part is taken out, as a result, the contact portion is peeled off at a boundary portion between the contact portion of the electric contact and the solder. Thus, the metal on the surface of the contact portion is not peeled off and transferred to the terminal side of the electrical part, Ni of the base layer is not exposed, and the low resistance can be maintained, so that even if the burn-in test is repeatedly carried out, the increasing of the electric resistance of the contact portion of the electric contact in an early stage can be suppressed.

BRIEF DESCRIPTION OF THE DRAWINGS

FIGS. 4A to 4D are enlarged sectional views showing a section analyzing result of a contact portion of a conventional probe.

FIGS. 5A to 5C are enlarged views showing a surface analyzing result of the contact portion of the conventional probe.

FIGS. 7A to 7E are sectional views, in an enlarged scale, representing a section analyzing result of a contact portion of a probe according to Ag—Pd plating of the first embodiment of the present invention.

FIGS. 9A to 9E are enlarged sectional views showing a section analyzing result of a contact portion of a probe according to an ion plating of the first embodiment of the present invention.

FIGS. 18A to 18D are enlarged sectional views showing a section analyzing result of a contact portion of a conventional probe.

FIGS. 20A to 20D are sectional views, in an enlarged scale, representing a section analyzing result of a contact portion of a probe according to Ag—Sn plating of a second embodiment of the present invention.

FIGS. 24A to 24D are enlarged sectional views showing a section analyzing result of a contact portion of a conventional probe.

FIGS. 26A to 26D are sectional views, in an enlarged scale, representing a section analyzing result of a contact portion of a probe according to Ag—ZnO composite of the third embodiment of the present invention.

FIGS. 30A to 30C are enlarged sectional views showing a section analyzing result of a contact portion of a probe according to Ag—C composite of the third embodiment.

FIGS. 32A to 32D are schematic sectional views showing a contact portion of the contact pin according to a fourth embodiment of the present invention.

FIGS. 40A to 40D are enlarged sectional views representing a section analyzing result of a contact portion of a probe having a contact material which is a material made of an Ag added with ZnO according to the fifth embodiment of the present invention.

BEST MODE FOR EMBODYING THE INVENTION

Next, the present invention will be explained hereunder.

First Embodiment of the Invention

FIGS. 1 to 10 represent the first embodiment of the present invention.

An electric contact in this first embodiment is herein a contact pin 11 arranged to an IC socket (socket for an electrical part) for a burn-in test, and electrically connects an IC package as an electrical part to a circuit board through the contact pin at the burn-in test time.

This IC package has a number of terminals on a lower surface of a rectangular package body, and the terminal is made of mainly Sn and includes no lead, so called "lead-free solder".

The IC socket has a socket body mounted to the circuit board and a number of contact pins are arranged to the socket body.

Figure 1:
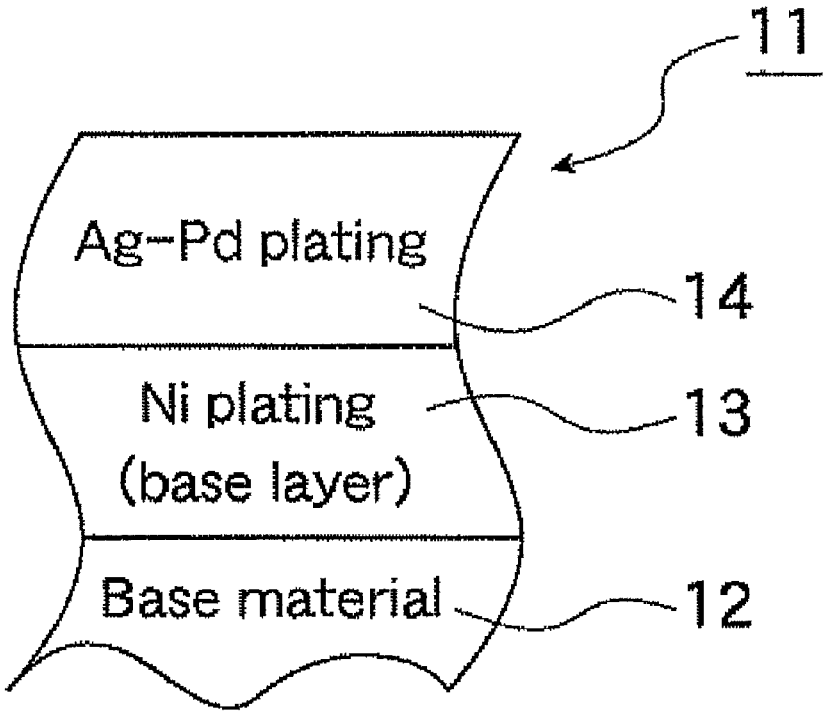
FIG. 1 is a frame format, in an enlarged scale, of a sectional view showing a contacting portion of a contact pin according to Ag—Pd plating of a first embodiment of the present invention.

The contact pin 11 is composed of, as shown in FIG. 1, a base material 12, a base layer 13, and outermost surface layer 14. The base material 12 is made of a material having conductivity and is herein made of phosphor bronze, and the base layer 13 is formed from an Ni plating having a thickness of 2-3 μm.

The outermost surface layer 14 is made of a material into which Sn is dissolved when heated and is herein formed of a Pd—Ag plating layer of about 1 μm thick, and the Ag is largely set in weight ratio.

This Pd—Ag plating layer is formed by, for example, a plating method or an ion plating method.

The plating method is performed by such a manner that the Ni plating of 2-3 μm thick is applied as the base layer 13, a strike gold plating is effected thereon as a bonding layer, and the Pd plating of 0.5 μm and the Ag plating of 0.5 μm are laminated as the outermost surface layer 14. Thereafter, the thus formed lamination is heated by a thermostat to a predetermined temperature to thermally diffuse the Pd and Ag. In this time, the weight ratio of the Pd and Ag is Pd:Ag=54:46, but this ratio may be freely changed by regulating the film thickness of the Pd plating layer and the Ag plating layer.

On the other hand, the ion-plating method is performed by such a manner that the Ni plating of 2-3 μm is applied as the base layer 13 and the Pd plating and Ag plating of 1 μm are laminated as the most outer layer 14 using ion plating method. In this time, the weight ratio of Pd and Ag is Pd:Ag=36:64, the Ag being larger.

The thus formed contact pin 11 is contacted to the terminal of the IC package to carry out the repeated burn-in tests. In a conventional test, an electric resistance of the contact pin 11 increased in an early stage, but in the present embodiment, the increasing of the electric resistance could be suppressed and the burn-in test could be appropriately carried out.

That is, in the conventional technology, the outermost surface layer of the contact pin 11 is an Au plating layer and the base layer 13 is made of Ni, so that in the repeated burn-in test of the IC package having the lead-free solder terminal, the Au is dissolved into the terminal side, and thus, the Au plating layer is vanished and Ni of the base layer 13 is exposed outside. Then, the Ni is oxidized in air and an oxidation film having large specific resistance is formed. As a result, the electric resistance of the contact portion of the contact pin 11 with respect to the terminal becomes large.

However, in this embodiment, since the plating layer made of Pd and Ag is provided for the outermost surface layer of the contact pin 11, Sn in the solder of the terminal of the IC package is transferred and dispersed into the outermost surface layer 14. Accordingly, the Pd and Ag are not dissolved into the IC package terminal side, and hence, Ni of the base layer 13 is never exposed. In addition, the Sn is hardly accumulated on the surface of the outermost layer 14 as oxide.

Therefore, even if the burn-in test is repeated, the increasing of the electric resistance, in an early stage, of the contact portion of the contact pin 11 can be suppressed.

Next, an evaluation test for confirming the effect of the present invention will be explained.

Herein, a probe 17 of the conventional Au plating in the burn-in test and a probe 18 having the outermost surface layer being formed of the Pd—Ag plating layer according to the present invention were compared in terms of their electric resistance increasing tendency.

(1) Test Content

The test was not an actual mount test using the contact pin but was a model test using a probe and a solder specimen having simple shapes for the reason of accurately evaluating characteristics of materials of the contact portion. That is, it is considered that in the contacting in a state in which the contact pins are arranged to the socket for the electrical part, much unstable factors exist, and reliability of reproducibility of the test conditions may includes a problem.

The probe and the solder specimen used in the present model test are specified as follows.

(2) Au Probe Specification

Phosphor bronze is used as the base material.

Figure 2B:
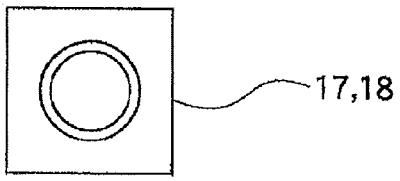
FIGS. 2A to 2C are views showing a probe according to the first embodiment.
Figure 2C:
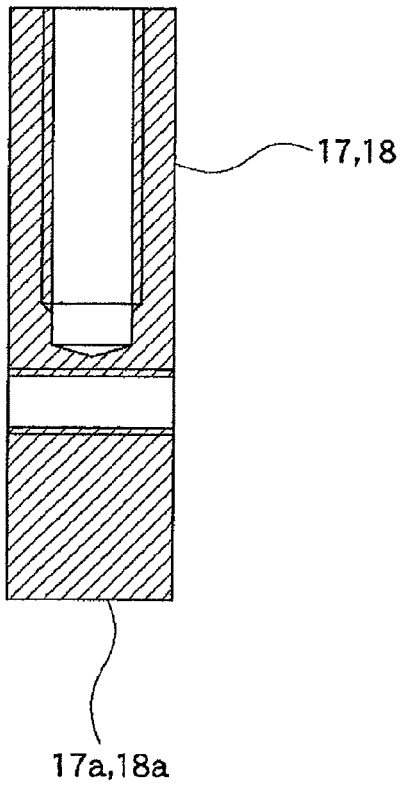
Figure 2A:
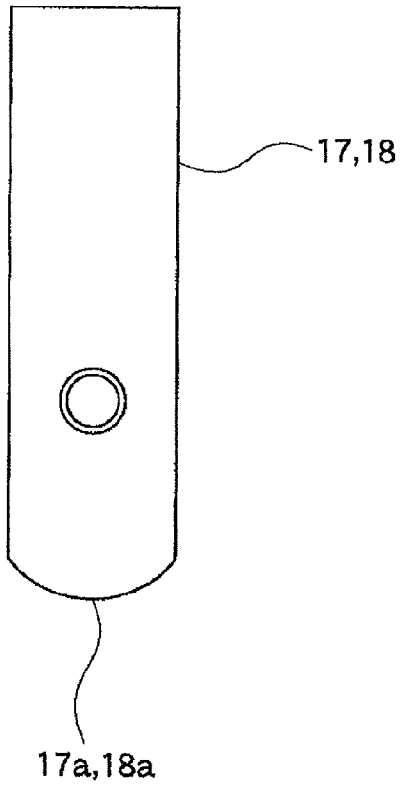

The probe 17 has a contact portion 17a having an R-shape as shown in FIG. 2.

Quality control and manufacture of this contact portion 17a was made in such a manner that the front end portion of the base material was ground by using grinding paper having #1200 roughness, and thereafter, was finished by using grinding paper having #4000 roughness. Thereafter, Ni plating of 2-3 μm was effected and Au plating of 0.8 μm was then applied thereon.

(3) Pd—Ag Probe Specification

Phosphor bronze is used as the base material.

The probe 18 has a contact portion 18a having an R-shape as shown in FIG. 2

Quality control and manufacture of the contact portion 18a was made by a plating manufacture method and ion-plating manufacture method.

Manufacture by plating: the front end portion of the base material was ground by using grinding paper having #1200 roughness, and thereafter, was finished by using grinding paper having #4000 roughness. Thereafter, Ni plating of 2-3 μm was effected, strike Au plating was then applied thereon as a bonding layer, Pd plating of 0.5 μm and Ag plating of 0.5 μm were alternately laminated, and the Pd and Ag were thermally diffused at a predetermined temperature by a thermostat. At this time, the weight ratio of Pd to Ag was Pd:Ag=36:64.

(4) Solder Specimen Specification

Phosphor bronze was used as the base material.

A solder specimen had such a shape, as shown in FIG. 3, that a section in a direction normal to the longitudinal direction was approximately semi-circular shape.

Manufacture: Ni plating of 2-3 μm was effected to the base material as a barrier layer, and lead-free solder plating of 10 μm was then applied thereon.

(5) Measuring Method

Resistance measuring method: four terminal method

Test Conditions

Contact load: 30 g (managed by weight)

Sliding distance: 0.5 mm (one direction)

Ambient temperature: room temperature—150° C.

Electric current: 80 mA

Test Cycle a) Contact the probe contact portions 17a, 18a to the solder specimen 20.

b) Slide the probe contact portions 17a, 18a with respect to the solder specimen 20.

c) Measure the resistance of the probe contact portions 17a, 18a.

d) Heat the probes 17, 18 to a temperature of 150° C.

e) Keep the probes 17, 18 at 150° C. for 6 hours.

f) Lower the temperature to the room temperature.

g) Leave to stand for 30 minutes in a non-contact state.

h) Move the probe contact portions 17a, 18a to a new surface of the solder specimen 20.

Carry out 40 cycles of the above a) to h) steps.

(6) Analysis of Section of Contact Portion

The above test cycle was carried out and the contact portions 17a, 18a of the respective probes 17, 18 were analyzed.

In the Au plated probe 17, when the burn-in test was repeated, the Au was dissolved into the solder specimen 20 and vanished, and Ni of the base layer was partially exposed.

That is, FIGS. 4A to 4D represent a result of the section analysis (8000 times) after the transfer of the contact portion 17a of the probe 17. In FIG. 4A which shows a component image, a thin color portion shows a section of the probe 17. In FIG. 4B, a thin color portion shows Au, in FIG. 4C, a thin color portion shows Sn, and in FIG. 4D, a thin color portion shows Ni. Further, FIGS. 5A to 5C represent a result of the surface analysis (8000 times) after the transfer of the contact portion 17a of the probe 17. In FIG. 5A which shows a component image, a whitish granular portion shows a transferred Sn and a dark granular portion Ni. In FIG. 5B, a dark color portion shows Ni, and a thin color portion shows the transferred Sn. In FIG. 5C, a dark color portion shows the transferred Sn and a thin color portion shows Ni. From FIGS. 5A to 5C, it will be found that Ni is exposed at portion of the surface of the contact portion 17a which Sn is not transferred.

Then, it is considered that the exposure of the Ni to air may form an oxide film having a large specific resistance, thus increasing the electrical contact resistance.

Figure 6:
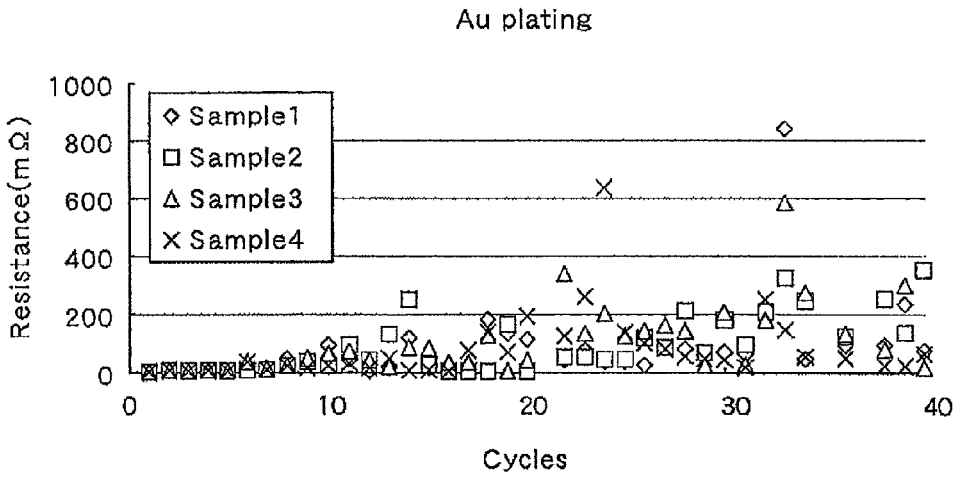
FIG. 6 is a graph representing a relationship between a cycle of the contact portion of the conventional probe and the electric resistance.

This will be confirmed from the graph of FIG. 6 showing a relationship between the cycle number and an electric resistance. This graph was prepared by measuring the electric resistance of the contact portion 17a at every cycle by using four samples of the probe 17, and as can be seen from this graph, it is found that as the cycle number increases, the electric resistance also increases.

On the other hand, with the probe 18 of Pd—Ag plating, Sn in the solder specimen 20 is transferred to the probe 18 and diffused to thereby form an alloy layer with both Ag and Pd, so that the Ni is not exposed to air and the Sn is hardly stored on the contact portion 18a as an oxide. The contact portion 18a becomes Sn—Pd—Ag alloy or segregated Ag having a relatively low electric resistance.

That is, FIGS. 7A to 7E show a result of section analysis (8000 times) of the contact portion 18a of the probe 18 after the transfer. FIG. 7A shows a component image, and in FIG. 7A, thin color portion shows the probe section, in FIG. 7B, thin color portion shows Ag, in FIG. 7C, thin color portion shows Pd, in FIG. 7D, thin color portion shows Sn diffused entirely, and in FIG. 7E, thin color portion shows Ni.

According to the above result, as shown in FIG. 7E, it is found that the Ni is not exposed to air at the surface of the contact portion 18a, and as shown in FIG. 7D, the Sn is diffused inside.

It is predicted that, in this diffusing process of the Sn, oxide films of various metals existing on the surface of the probe 18 of Pd—Ag plating are destroyed. Further, for the Sn diffused portion, even if it is oxidized, its oxide film is physically easily destroyed by the contact with the solder specimen 20 in comparison with an oxide film of Ni.

It is therefore considered that the increasing of the electric resistance of the contact portion 18a can be suppressed by the above matters.

Figure 8:
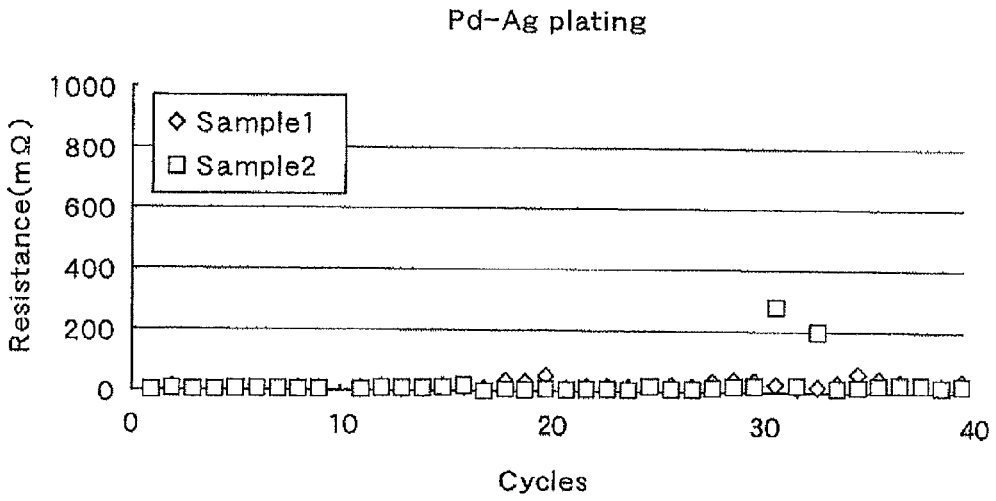
FIG. 8 is a graph representing a relationship between a cycle of the contact portion of the probe according to Ag—Pd plating of the first embodiment and an electric resistance.

This will be confirmed by the graph of FIG. 8 representing a relationship between the cycle number and an electric resistance. This graph was prepared by measuring the electric resistance of the contact portion 18 at every cycle by using two samples of the probe 18, and as can be seen from this graph, it is found that even if the cycle number increases, the electric resistance does not increase.

Further, FIGS. 9A to 9E show a result of the contact portion section analysis by the Pd—Ag ion plating, and it is found that as like as the Pd—Ag plating, the Ni is not exposed to air at the surface of the contact portion and the Sn is diffused inside.

Figure 10:
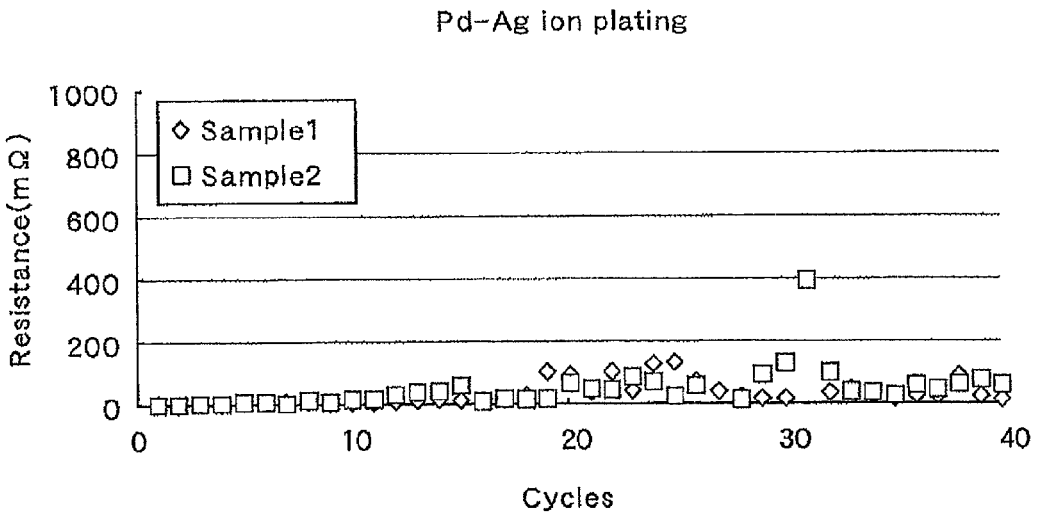
FIG. 10 is a graph representing a relationship between a cycle of the contact portion of the probe according to the ion plating of the first embodiment and an electric resistance.

Furthermore, it is also found from the graph of FIG. 10 that even if the cycle number increases, the electric resistance does not increase.

FIGS. 11 to 16 represent modified examples different from the first embodiment mentioned hereinabove.

Figure 11:
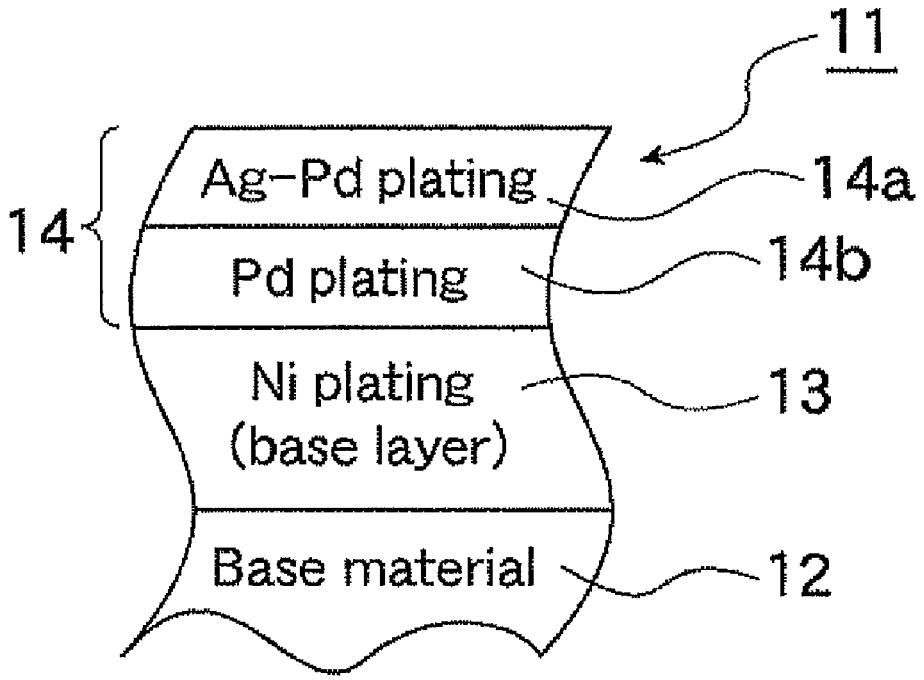
FIG. 11 is a frame format, in an enlarged scale, of a sectional view showing a contact portion of a contact pin of a modified embodiment corresponding to FIG. 1 of the present invention.
Figure 12:
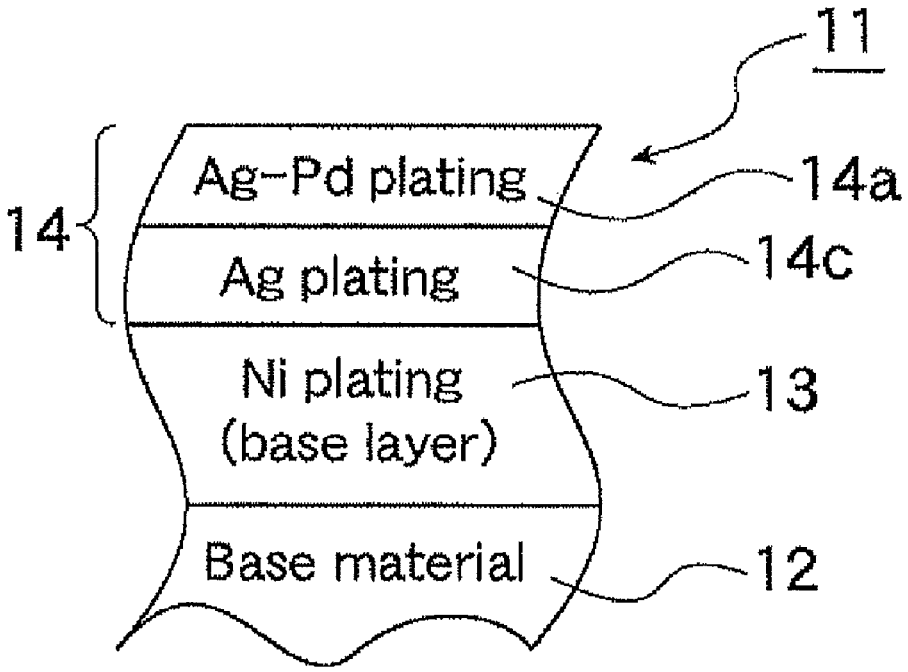
FIG. 12 is a frame format, in an enlarged scale, of a sectional view showing a contact portion of a contact pin of another modified embodiment corresponding to FIG. 1 of the present invention.
Figure 13:
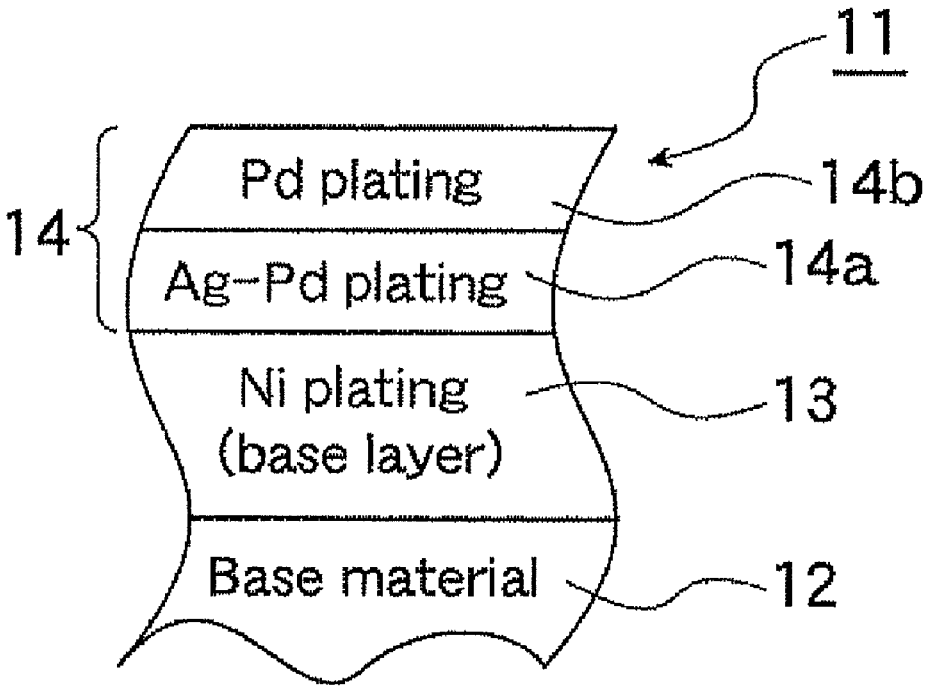
FIG. 13 is a frame format, in an enlarged scale, of a sectional view showing a contact portion of a contact pin of a further modified embodiment corresponding to FIG. 1 of the present invention.
Figure 14:
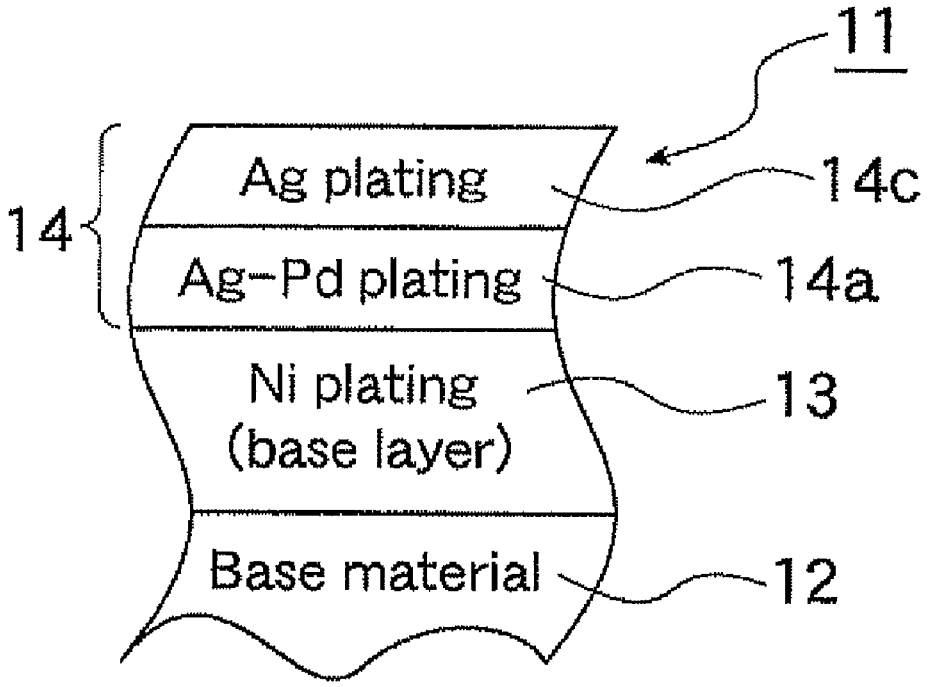
FIG. 14 is a frame format, in an enlarged scale, of a sectional view showing a contact portion of a contact pin of a further modified embodiment corresponding to FIG. 1 of the present invention.
Figure 15:
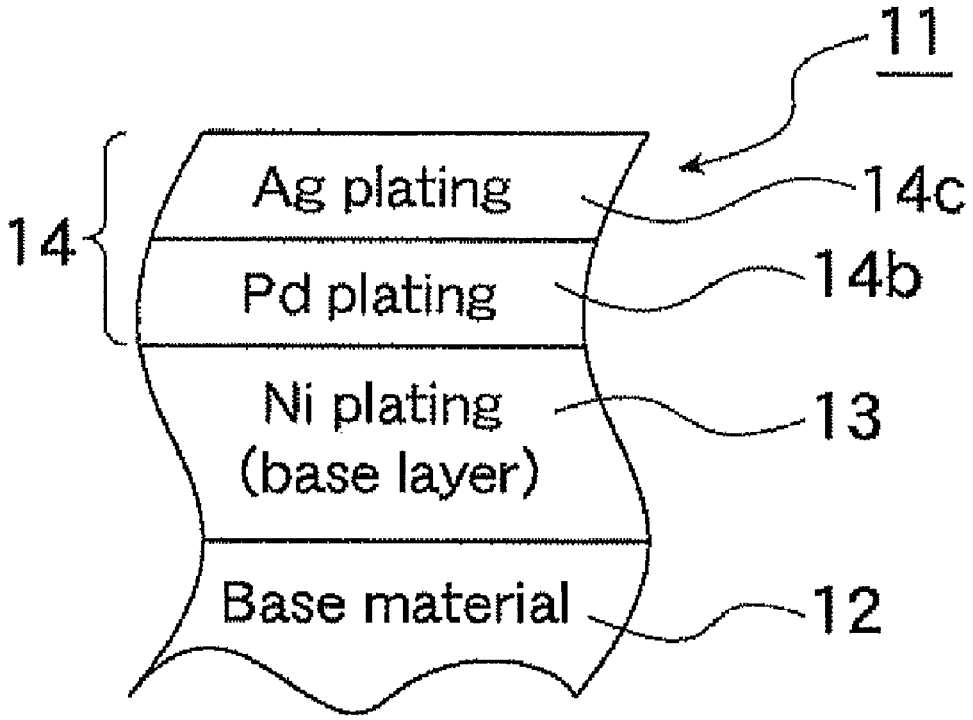
FIG. 15 is a frame format, in an enlarged scale, of a sectional view showing a contact portion of a contact pin of a further modified embodiment corresponding to FIG. 1 of the present invention.
Figure 16:
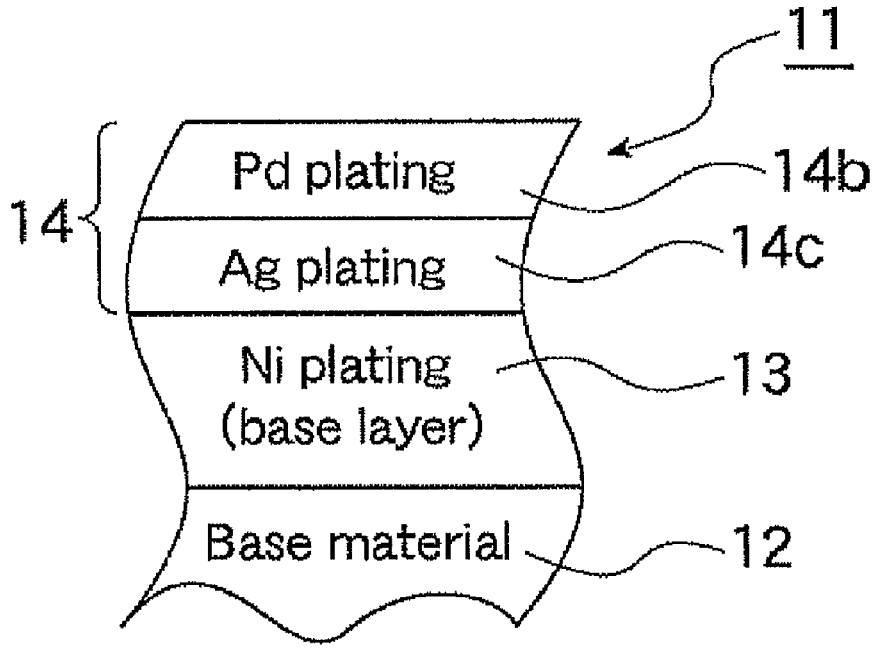
FIG. 16 is a frame format, in an enlarged scale, of a sectional view showing a contact portion of a contact pin of a further modified embodiment corresponding to FIG. 1 of the present invention.

The contact pin 11 shown in FIG. 11 has a Pd plating layer 14b between the Pd—Ag plating layer 14a and the base layer 13, the contact pin shown in FIG. 12 has an Ag-plating layer 14c between the Pd—Ag plating layer 14a and the base layer 13, the contact pin 11 shown in FIG. 13 has a Pd plating layer 14b on the Pd—Ag plating layer 14a, the contact pin 11 shown in FIG. 14 has an Ag-plating layer 14c on the Pd—Ag plating layer 14a, the contact pin 11 shown in FIG. 15 has a Pd plating layer 14b and an Ag-plating layer 14c laminated in this order on the base layer 13, and the contact pin shown in FIG. 16 has an Ag-plating layer 14c and an Pd plating layer 14b laminated in this order on the base layer 13.

In these contact pins 11, the plating layer composed of Pd and Ag is formed as the outermost surface layer of the contact pin 11, so that Sn in the solder of the IC package terminal is transferred and diffused into the outermost surface layer 14 of the contact pin 11 under a burn-in environment (temperature of 80 to 170° C.). Accordingly, the Pd and Ag are not dissolved into the IC package terminal side, and Ni of the base layer 13 is not exposed. In addition, the Sn is hardly stored as oxide on the outermost surface layer 14. As a result, even if the burn-in test is repeated, the early increasing of the electric resistance of the contact portion of the contact pin 11 can be effectively suppressed.

Second Embodiment of the Present Invention

FIGS. 17 to 21 represent the second embodiment according to the present invention.

Figure 17:
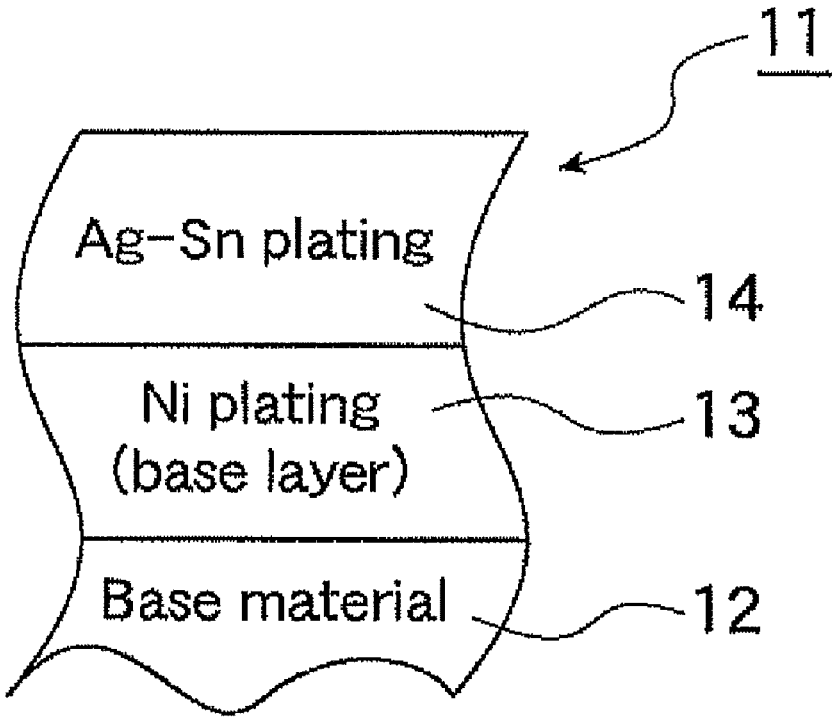
FIG. 17 is a frame format, in an enlarged scale, of a sectional view showing a contact portion of a contact pin according to Ag—Sn plating of a second embodiment of the present invention.

The contact pin 11 according to the second embodiment is composed of, as shown in FIG. 17, a base material 12, a base layer 13 and an outermost surface layer 14. The base material 12 is made of a conductive material such as phosphor bronze herein. The base layer 13 is formed of the Ni plating having a thickness of 2 to 3 μm.

Moreover, the outermost surface layer 14 is made of a material into which Sn is dissolved by applying heat, and Ag—Sn (Ag: 10 weight %) plating layer having a thickness of about 1 μm, herein. The weight ratio of Ag to Sn is 80 or more weight % of Ag to the remaining Weight % of Sn.

This Ag—Sn plating layer is formed by, for example, a plating method or an ion-plating method.

According to the contact pin 11 formed by such manufacturing method, the increasing of the electric resistance can be suppressed and the burn-in test can be appropriately carried out contrary to the conventional method in which the electric resistance is increased in an early stage, by repeatedly performing the burn-in test in contact of the contact pin with the IC package terminal.

That is, in the conventional method, since the outermost surface layer 14 of the contact pin 11 is made of the Au-plating layer and the base layer 13 is made of the Ni material, in the repeated burn-in test of the IC package having the lead-free solder terminal, the Au is dissolved into the terminal side, the Au plating layer is vanished, and Ni in the base layer 13 is exposed to air. The Ni is then oxidized in air and an oxide film having high specific resistance is formed. As a result, the electric resistance of the contact portion of the contact pin 11 to the terminal is made high.

In the present embodiment however, since the plating layer made of Ag and Sn is provided for the outermost surface layer 14 of the contact pin 11, Sn in the solder of the terminal of the IC package is transferred and diffused into the outermost surface layer 14 of the contact pin 11 at the burn-in environment at a temperature of 80 to 170° C. Accordingly, the Sn is hardly stored as an oxide on the surface of the outermost surface layer 14 of the contact pin 11 with the Ag and Sn being not dissolved into the terminal side of the IC package and with Ni of the base layer 13 being not exposed outside.

Therefore, even if the burn-in test is repeated, the early increasing of the electric resistance of the contact portion of the contact pin 11 can be effectively suppressed.

Hereunder, an evaluation test confirming the effects of the present invention will be explained.

Herein, the probe 17 of the conventional Au plating and the probe 18 having the outermost surface layer of the Pd—Ag plating layer in the burn-in test were compared in terms of electric resistance increasing tendency.

(1) Test Content

A model test, not a mount test using an actual contact pin, using a simple shaped probe and solder specimen was performed. This was done to get more accurate evaluation of characteristics of a material of the contact portion. That is, in the contact in which the contact pin is mounted to a socket for an electrical part, there are many unstable factors, and reliability in reproducibility of the test condition may include a problem.

The probe and solder specimen used for the present model test have the following specifications.

(2) Au-Probe Specification.

Phosphor bronze was used as the base material.

The probe 17 has the shape such that the contact portion 17a thereof has an R-shape as shown in FIG. 2.

The quality control and manufacture of this contact portion 17a were such that the front end of the base material was ground by a grinding paper of #1200 roughness, and thereafter, was finished by using a grinding paper of #4000 roughness. A Ni plating was thereafter effected so as to have a thickness of 2-3 μm, and the Au plating of 0.8 μm thick was then applied thereon.

(3) Ag—Sn Probe Specification

Phosphor bronze was used as the base material.

The probe 18 has a shape such that the contact portion 18a thereof has an R-shape as shown in FIG. 2.

The quality control and manufacture of this contact portion 18a were effected by the plating method and the ion-plating method.

Plating method: the front end of the base material was ground by a grinding paper of #1200 roughness, and thereafter, was finished by using a grinding paper of #4000 roughness. A Ni plating was thereafter effected so as to have a thickness of 2-3 μm and an Ag—Sn (Ag 10 weight %) plating of 1.0 μm was then applied thereon.

(4) Solder Specimen Specification

Glass epoxy material was used as the base material.

Figure 3B:
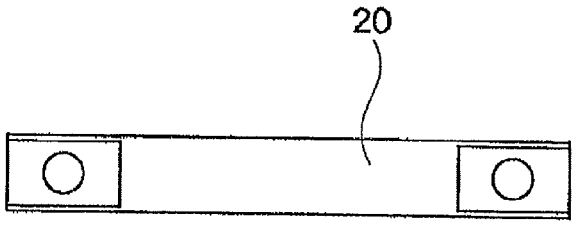
FIGS. 3A to 3C are solder material specimens according to the first embodiment.
Figure 3C:
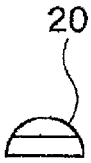
Figure 3A:
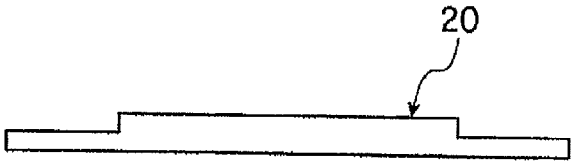

A solder specimen 20 had such a shape, as shown in FIGS. 3A to 3C, that a section in a direction normal to the longitudinal direction was approximately semi-circular shape.

Manufacture: Au was printed on the glass epoxy substrate and a lead-free (Sn-3 Ag-0.5 Cu) paste solder was screen-printed and then reflowed.

(5) Measuring Method

Resistance measuring method: four terminal method

Test Conditions

Contact load: 15 g (managed by weight)

Ambient temperature: room temperature—150° C.

Electric current-80 mA

Test Cycle a) Contact the probe contact portions 17a and 18a to the solder specimen 20.

b) Measure the resistance of the probe contact portions 17a and 18a.

c) Heat the probes 17 and 18 to a temperature of 150° C.

d) Keep the probes 17 and 18 at 150° C. for 6 hours.

e) Lower the temperature to the room temperature.

f) Leave to stand for 30 minutes in a non-contact state.

g) Move the probe contact portions 17a and 18a to a new surface of the solder specimen 20.

Carry out 40 cycles of the above a) to g) steps.

(6) Total Test Procedure a) Observe and photograph the probes 17a and 18a by a microscope.

b) Repeat the test cycle mentioned above, change the solder specimen 20 with new one at every 15 cycles, and at that time, observe and photograph contact flaws of the contact portions 17a and 18a at the probe front end portions and the solder specimen 20 by the microscope.

c) End the test at 40 cycles, and observe and photograph the contact flaws of the contact portions 17a and 18a at the probe front end portions and the solder specimen 20 by the microscope.

d) Analyze element on the surfaces of the contact portions 17a and 18a of the probe front end portions.

e) Analyze element of sections of the contact portions 17a and 18a of the probe front end portions.

(7) Analysis of Sectional Area of Contact Portion

The above test cycles were performed and the contact portions 17a and 18a of the respective probes were analyzed.

For the probe 17 of the Au plating, when the burn-in test was repeated, the Au was dissolved in the solder specimen side and vanished, and a part of the base layer of Ni was exposed.

That is, FIG. 18 shows a result of the section analysis (8000 times) after the transfer of the contact portion 17a of the probe 17, in which FIG. 18A represents a component image having slightly thin color portion showing the section of the probe 17, and in FIG. 18B, the thin color portion shows Au, in FIG. 18C, the thin color portion shows Sn, and in FIG. 18D, thin color portion shows Ni. From this figure, it is found that Ni was exposed to air at the surface of the contact portion 17a.

This Ni forms an oxide film in air having high specific resistance by the exposure of the Ni, and because of this reason, it is considered that the contact resistance increases.

Figure 19:
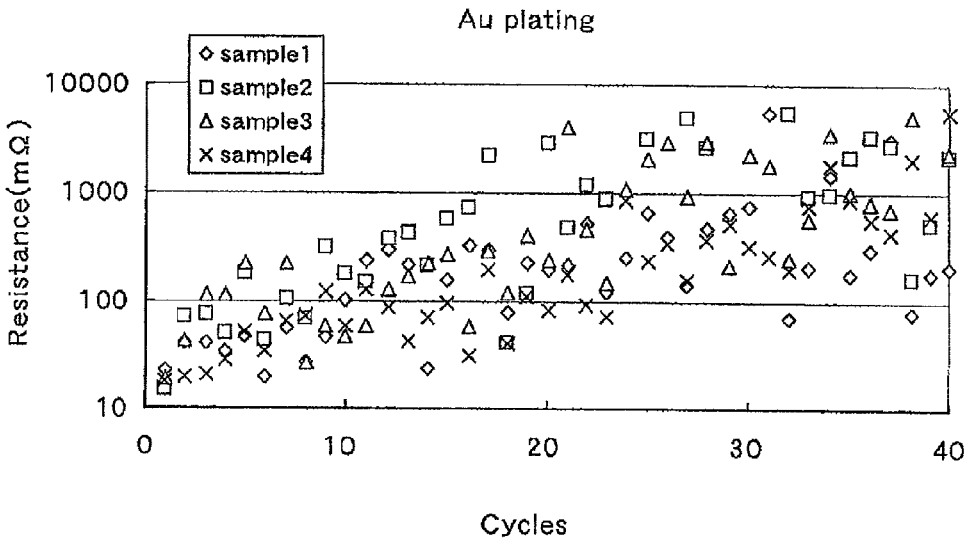
FIG. 19 is a graph representing a relationship between a cycle of the contact portion of the conventional probe and an electric resistance.

For the confirmation of this matter, FIG. 19 shows a graph representing a relationship between the cycle number and an electric resistance. This graph shows the measured result of the electric resistance of the contact portion 17a at every cycle using four samples of the probe 17, and from this graph, it is found that as the cycle number increases, the electric resistance also increases.

On the other hand, in the probe 18 of the Ag—Sn plating, there is no case of vanishing the outermost surface, and hence, the base layer Ni on the probe 18 side is never exposed. This is considered as one reason for keeping the low resistance. In the probe 18 of the Ag—Sn plating, it is predicted from FIG. 20 that the transfer of a substance generated between the contact portion 18a of the probe 18 side and the contact portion on the solder specimen 20 side is a diffusion of the Sn into the contact portion on the probe 18 side from the contact portion 18a of the solder specimen 20 side. In the process of this Sn diffusion, it is predicted that the oxide layer of the respective metals of the contact portion surface is destroyed, and this is considered as another one reason for keeping the low resistance. Furthermore, it is also considered that the Sn diffused portion of the contact portion 18a on the probe 18 side of the Ag—Sn plating is likely destroyed physically by the contacting to the solder specimen 20 in comparison with an oxide film of Ni even if the Sn diffused portion is oxidized.

That is, FIGS. 20A to 20D show the section analysis results (8000 times) after the transfer of the contact portion 18a of the probe 18, and FIG. 20A shows a component image and in FIG. 20A, thin color portion shows the section of the probe, in FIG. 20B, thin color portion shows the Ag, in FIG. 20C, thin color portion shows the Sn, and in FIG. 20D, thin color portion shows the Ni.

Accordingly, as shown in FIG. 20D, Ni is not exposed to air at the surface of the contact portion 18a, and as also shown in FIG. 20C, the Sn is diffused inside.

It is considered that this shows that the increasing in the electric resistance of the contact portion 18a is suppressed.

Figure 21:
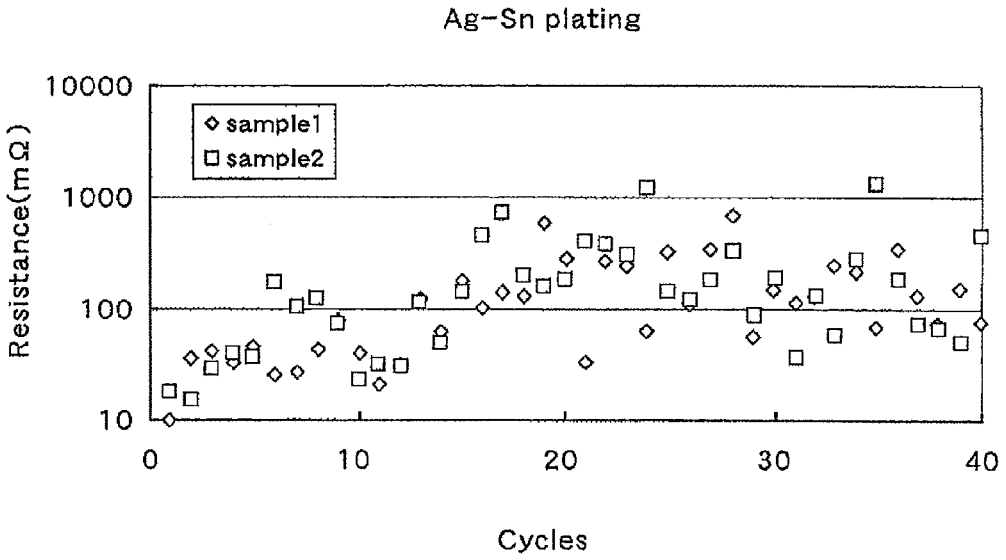
FIG. 21 is a graph representing a relationship between a cycle of the contact portion of the probe according to the Ag—Sn plating of the second embodiment and the electric resistance.

As confirmation of the above matter there is a graph showing a relationship between the cycle number and the electric resistance of FIG. 21 according to the measurement result. This graph shows the measurement result of the electric resistance of the contact portion 18a at every cycle using two samples of the probe 18, and in comparison of this graph of FIG. 21 with the graph of conventional FIG. 19, it is found that even if the cycle number increases the electric resistance shown in FIG. 21 does not increase.

Third Embodiment of the Invention

FIGS. 22A to 31 show the third embodiment of the present invention.

An electric contact of this third embodiment is a contact pin disposed to an IC socket (socket for an electrical part) for a burn-in test, and the IC package as electrical part and a circuit board are electrically connected through this contact pin at the time of the burn-in test.

The IC package has a number of terminals on a lower surface of a rectangular package body, and the terminal is mainly made of Sn and includes no lead, so-called "lead-free solder".

The IC socket has a socket body mounted to the printed circuit board, and a number of contact pins are arranged to the socket body.

The contact pin 11 is formed from a composite material of Ag—ZnO substance as the composite material of an Ag-an oxide of a metal element, into which Sn (tin) is dissolved and diffused by applying heat. In this case, the weight ratio of Ag:ZnO is 89.7:10.3, and Ag is more than 80%.

Further, the contact pin can be made of Ag—$SnO_2$ substance as well as an Ag—ZnO substance as a composite material of an Ag-metal oxide.

In addition, the contact pin may be made of a composite material of Ag—C substance as a composite material of an Ag-a substance other than metal. In this case, the weight ratio of Ag:C is 99:1, and Ag is more than 80%.

According to this matter, it is found that, by repeatedly carrying out the burn-in test by contacting the contact pin to the terminal of the IC package, in the conventional technology, the electric resistance of the contact pin was increased in an early stage, but according to the present embodiment the increasing of the electric resistance can be suppressed and the burn-in test can be appropriately performed.

That is, in the conventional technology, the outermost layer of the contact pin is formed of an Au plating layer and the base layer is made of the Ni, so that in the repeated burn-in test of the IC package having the lead-free solder terminal, the Au is dissolved into the terminal side, and thus the Au plating layer is varnished and Ni of the base layer is exposed. Then, the Ni is oxidized in air and an oxide film having high specific resistance is formed. As a result, it is considered that the electric resistance of the contact portion of the contact pin with respect to the terminal becomes high.

However, in this embodiment, since the contact portion of the contact pin is made of the Ag—ZnO composite or Ag—C composite, the Sn is diffused deeply inside of the contact portion and the Sn is hardly accumulated as an oxide on the surface of the contact portion, thus keeping the low resistance.

Thus, even if the burn-in test is repeated, an early increase in the electric resistance of the contact portion of the contact pin can be suppressed.

Next, an evaluation test for confirming the advantageous effects of the present invention will be described.

Herein, a probe 117 of the conventional Au plating in the burn-in test and a probe 118 having the contact portion made of the Ag—ZnO composite or a probe 119 having the contact portion made of the Ag—C composite according to the present invention were compared in terms of their electric resistance increasing tendency by carrying out burn-in tests.

(1) Test Content

The test was not a actual mount test using the contact pin but was a model test using probes 117, 118 and 119 having simple shapes and a solder specimen 120 for the reason of accurately evaluating characteristics of materials of the contact portion. That is, it is considered that in the contact state in which the contact pins are arranged to the socket for the electrical part, many unstable factors exist and reliability of reproducibility of the test conditions may include a problem.

The probes 117, 118, 119 and the solder specimen 120 used in the present model test are specified as follows.

(2) Au Probe Specification

Phosphor bronze is used as the base material.

Figure 22B:
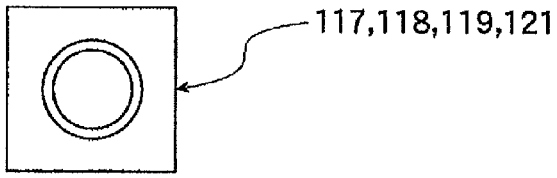
FIGS. 22A to 22C are views showing a probe for evaluation test according to a third embodiment of the present invention.
Figure 22C:
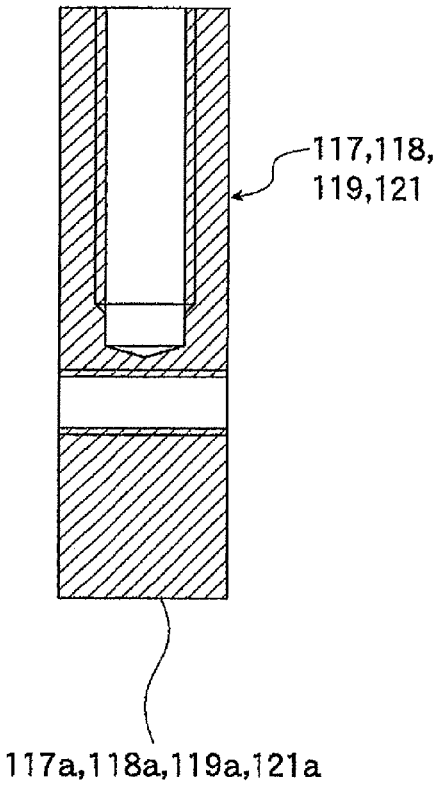
Figure 22A:
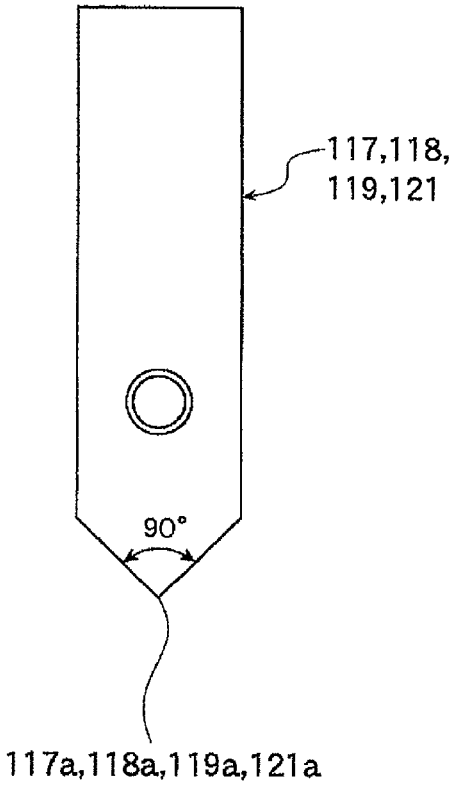

The probe 117 has a contact potion 117a having a right angle of 90 degrees as shown in FIGS. 22A to 22C.

Quality control and manufacture of this contact portion 117a was made in a manner such that the front end portion of the base material was ground by using grinding paper having #1200 roughness, and thereafter, was finished by using grinding paper having #4000 roughness. Thereafter, Ni plating of 2-3 μm was effected and Au plating of 0.8 μm was then applied thereon.

(3) Ag—ZnO Probe Specification

The whole is made of the Ag—ZnO composite with the weight ratio of Ag:ZnO=89.7:10.3.

The probe 118 has a contact portion 118a having an angle of 90 degrees as shown in FIGS. 22A to 22C.

Both the surfaces of the front end portion of the contact portion 118a are ground with a grinding paper of #1200 roughness, and thereafter, finished with a grinding paper of #4000 roughness.

(4) Ag—C Probe Specification

The whole is made of the Ag—C composite with the weight ratio of Ag:C=99:1.

The probe 119 has a contact portion 11a having an angle of 90 degrees as shown in FIG. 22.

Both the surfaces of the front end portion of the contact portion 119a are ground with a grinding paper of #1200 roughness, and thereafter, finished with a grinding paper of #4000 roughness.

(5) Solder Specimen Specification

Glass epoxy material was used as the base material.

Figure 23A:
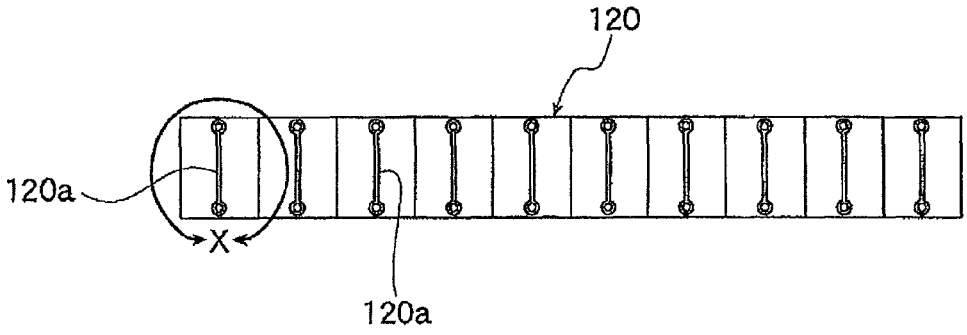
FIGS. 23A and 23B are views showing a solder specimen for the evaluation test according to the third embodiment.
Figure 23B:
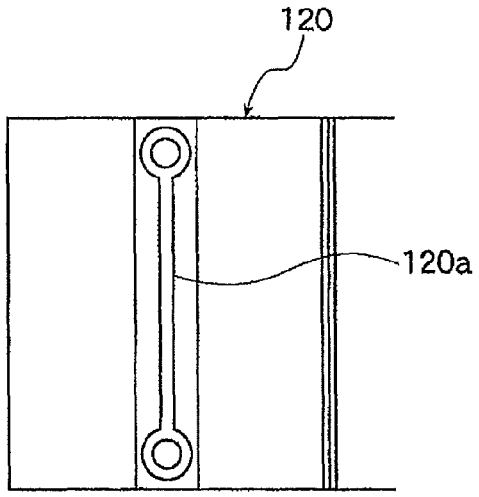

A solder specimen 120 was prepared by printing Cu/NiAu to a glass epoxy substrate, as shown in FIGS. 23A and 23B, had such a shape, screen-printing a lead-free paste solder (Sn—Ag—Cu, weight ratio of 96.5:3:0.5) on the thus formed glass epoxy substrate and having the same reflowed by a surface tension to thereby form a contact portion 120a.

(6) Measuring Method

Resistance measuring method: four terminal method

Test Conditions

Contact load: 15 g (managed by weight)

Ambient temperature: room temperature—150° C.

Electric current; 80 mA

Test Cycle a) Contact the probe contact portions 117a, 118 a and 119a to the solder specimen 120.

b) Measure the resistance of the probe contact portions 117a, 118a and 119a.

c) Heat the probes 117, 118 and 119 to a temperature of 150° C.

d) Keep the probes 117, 118 and 119 at 150° C. for 6 hours.

e) Lower the temperature to a room temperature.

f) Leave to stand for 30 minutes in a non-contact state.

g) Move the probe contact portions 117a and 119a to a new surface of the solder specimen 120.

Carry out 40 cycles of the above a) to g) steps.

(7) Analysis of Section of Contact Portion

The above test cycle was carried out and the contact portions 117a, 118a and 119a of the respective probes 117, 118 and 119 were analyzed.

In the Au plated probe 117, when the burn-in test was repeated, the Au was dissolved into the solder specimen 120 and the Au plating layer was vanished, and the base layer Ni was partially exposed.

That is, FIGS. 24A to 24D represent a result of the section analysis (8000 times) after the transfer of the contact portion 117a of the probe 117. FIG. 24A shows a component image, in which thin color portion shows a section of the probe contact portion 117a, in FIG. 24B, thin color portion shows Au, in FIG. 24C, thin color portion shows Sn, and in FIG. 24D, thin color portion shows Ni. Further, from FIG. 24D, it will be found that Ni is exposed on the surface of the contact portion 117a.

Then, it is considered that the exposure of the Ni to air may form an oxide film having a high specific resistance, thus increasing the electrical contact resistance.

Figure 25:
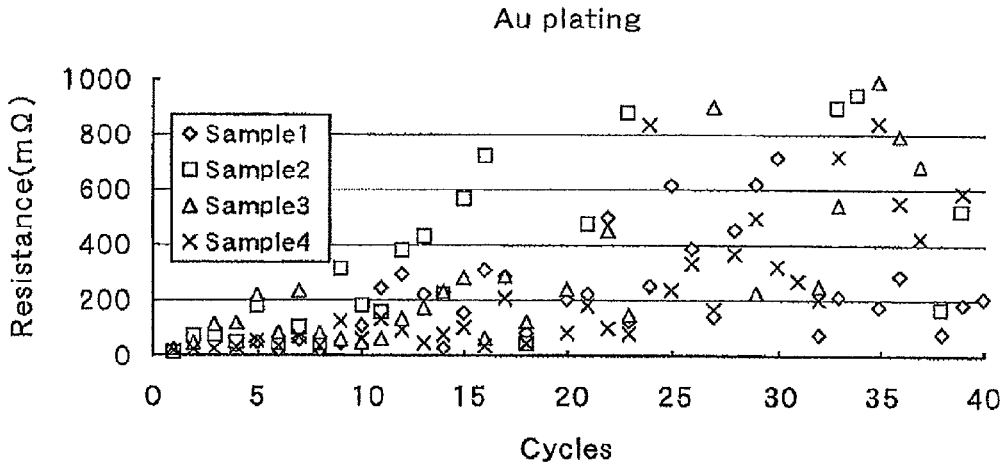
FIG. 25 is a graph representing a relationship between a cycle of the contact portion of the conventional probe and an electric resistance.

This will be confirmed from the graph of FIG. 25 showing a relationship between the cycle number and the electric resistance. This graph was prepared by measuring the electric resistance of the contact portion 117a at every cycle by using four samples of the probe 117, and as can be seen from this graph, it is found that as the cycle number increases, the electric resistance is also increased.

On the other hand, with the probe 118 of Ag—ZnO composite, Sn in the solder specimen 120 is transferred to the probe 118 and diffused inside to thereby destroy oxide layer of the respective metals on the surface of the contact portion 118a. Further, the transfer of the substance between the contact portion 118a of the probe 118 side and the contact portion 120a of the solder specimen 120 side is the transfer of the Sn to the contact portion 118a of the probe 118 side from the contact portion 120a of the solder specimen 120 side. Accordingly, it is considered that the surface of the probe 118 is never vanished, and even if Ni exists as the base layer on the probe 118 side, the Ni is never exposed outside.

That is, FIGS. 26A to 26D show a result of section analysis (8000 times) of the contact portion 118a of the probe 118 after the transfer. FIG. 26A shows a component image, and in FIG. 26A, thin color portion shows the section of the probe contact portion 118a, in FIG. 26B, thin color portion shows Ag, in FIG. 26C, thin color portion shows Zn, in FIG. 26D, thin color portion shows Sn.

According to the above result, as shown in FIG. 26D, it is found that the Sn is diffused inside, and it is predicted that the oxide film of the respective metals existing on the surface of the contact portion 118a is destroyed during the diffusion of this Sn. Further, it is also considered that in the Sn diffused portion of the contact portion 118a, even if the surface is oxidized, the oxide film will be easily physically destroyed by the contact of the solder specimen 120, in comparison with the oxide film of the Ni.

In addition, it is considered that the increasing of the contact resistance of the contact portion 118a is suppressed by the above fact.

Figure 27:
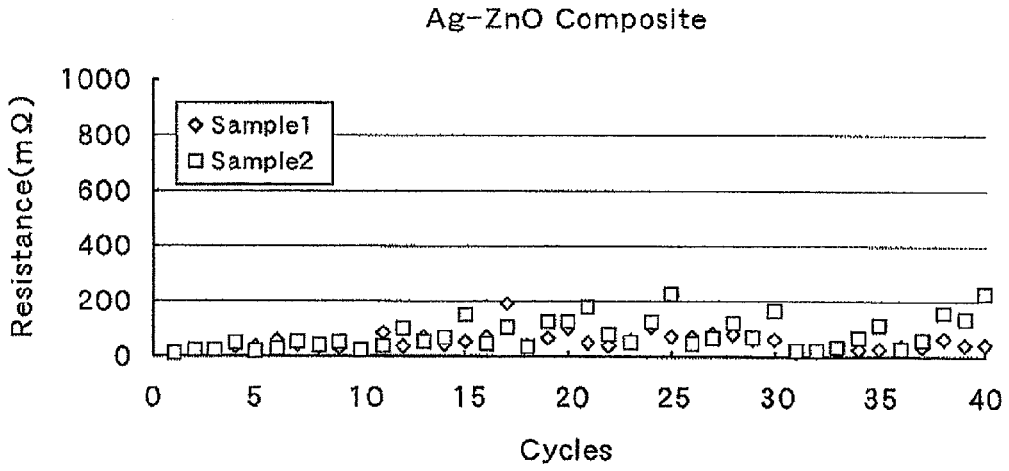
FIG. 27 is a graph representing a relationship between a cycle of the contact portion of the probe according to Ag—ZnO composite of the third embodiment and an electric resistance.

This will be confirmed by the graph of FIG. 27 representing a relationship between the cycle number and the electric resistance. This graph was prepared by measuring the electric resistance of the contact portion 118a at every cycle by using two samples of the probe 118, and as can be seen from this graph, it is found that even if the cycle number increases, the electric resistance does not increase.

Furthermore, for the probe 119 of the Ag—C composite it is considered that the oxide layer of the respective metals on the surface of the contact portion 119a is destroyed by transferring the Sn in the solder specimen 120 to the probe 119 and then diffusing it inside. In addition, the transfer of the substance between the contact portion 119a of the probe 119 side and the contact portion 120a of the solder specimen 120 side is the transfer of the Sn to the contact portion 119a of the probe 119 side from the contact portion 120a of the solder specimen 120 side. Accordingly, it is considered that the surface of the probe 119 is never vanished, and even if the Ni exists as the base layer on the probe 119 side, the Ni is never exposed outside.

Figure 28A:
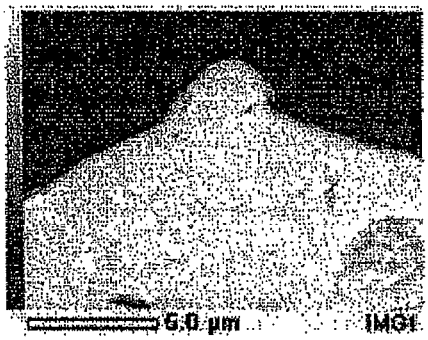
FIGS. 28A to 28C are enlarged sectional views showing a section analyzing result of a contact portion of a probe according to Ag—C composite of the third embodiment.
Figure 28B:
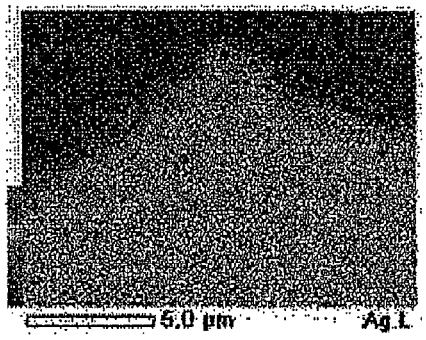
Figure 28C:
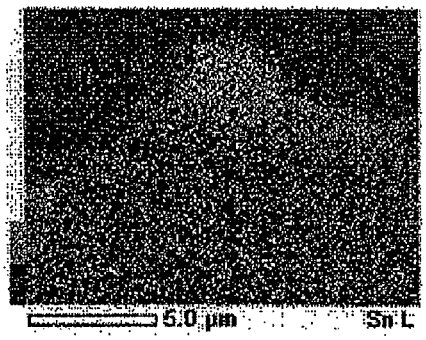

That is, FIGS. 28A to 28C show a result of section analysis (8000 times) of the contact portion 119a of the probe 119 after the transfer. FIG. 28A shows a component image, and in FIG. 28A, thin color portion shows the section of the probe contact portion 119a, in FIG. 28B, thin color portion shows Ag, and in FIG. 28C, thin color portion shows Sn.

According to the above result, as shown in FIG. 28C, it is found that the Sn is diffused inside, and it is predicted that the oxide film of the respective metals existing on the surface of the contact portion 119a is destroyed during the diffusion of this Sn. Further, it is also considered that in the Sn diffused portion of the contact portion 119a, even if the surface is oxidized, the oxide film will be easily physically destroyed by the contact to the solder specimen 120 in comparison with the oxide film of the Ni.

In addition, it is considered that the increasing of the contact resistance of the contact portion 119a is suppressed by the above fact.

Figure 29:
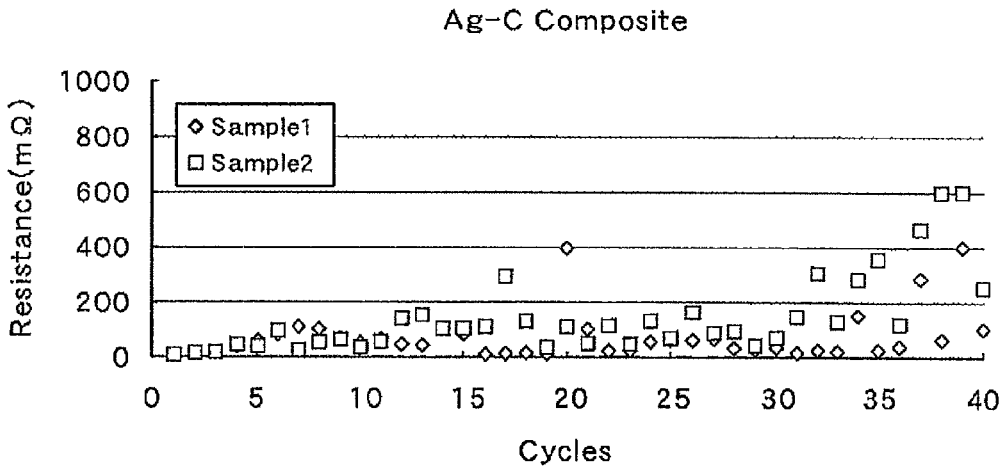
FIG. 29 is a graph representing a relationship between a cycle of the contact portion of the probe according to Ag—C composite of the third embodiment and the resistance.

This will be confirmed by the graph of FIG. 29 representing a relationship between the cycle number and the electric resistance. This graph was prepared by measuring the electric resistance of the contact portion 119a at every cycle by using two samples of the probe 119, and as can be seen form this graph, it is found that even if the cycle number increases, the electric resistance does not increase rapidly.

Next, the electric resistance increasing tendencies in the burn-in test were compared between the conventional probe 117 of Au plating and the probe 121 of the contact portion of Ag—$SnO_2$ composite.

The test contents of this embodiment are similar to those of the Ag—ZnO case and the Ag—C case mentioned hereinbefore. For example, the probe 121 of the Ag—$SnO_2$ composite has the weight ratio of Ag:$SnO_2$=90.0:10.0, and both the surfaces of the front end of the probe 121 were ground by a grinding paper of #1200 roughness, and thereafter, finished with a grinding paper of #4000.

In this probe 117 of the Au plating, it is considered, as mentioned before, that since Ni is exposed to air and forms an oxide film having high specific resistance, so that the contact resistance increases.

On the other hand, for the probe 121 of the Ag—$SnO_2$ composite, it was observed that the Sn was diffused deeply inside of the probe 121. Accordingly, in the probe 121 of the Ag—$SnO_2$ composite, it is considered that during the diffusing process of the Sn at the contact portion 121a, the destroy of the oxide layer of the respective metals at the surface of the probe side contact portion is a reason for maintaining a low resistance. Furthermore, it is also considered that the Sn diffused portion of the probe 121 of the Ag—$SnO_2$ composite will be easily physically destroyed, even if its surface is oxidized, by the contact to the solder specimen 120 in comparison with the oxide film of the Ni.

FIGS. 30A to 30C show a result of section analysis (8000 times) of the contact portion 121a of the probe 121 after the transfer. FIG. 30A shows a component image, and in FIG. 30A, thin color portion shows the section of the probe contact portion 121a, in FIG. 30B, thin color portion shows Ag, and in FIG. 30C, thin color portion shows Sn.

According to the above result, as shown in FIG. 30C, it is found that the Sn is diffused inside, and it is predicted that the oxide film of the respective metals existing on the surface of the contact portion 121a is destroyed during the diffusion of this Sn. Further, it is also considered that in the Sn diffused portion of the contact portion 121a, even if the surface is oxidized, the oxide film will be easily physically destroyed by the contact to the solder specimen 120 in comparison with the oxide film of the Ni.

In addition, it is considered that the increasing of the contact resistance of the contact portion 121a is suppressed by the above fact.

Figure 31:
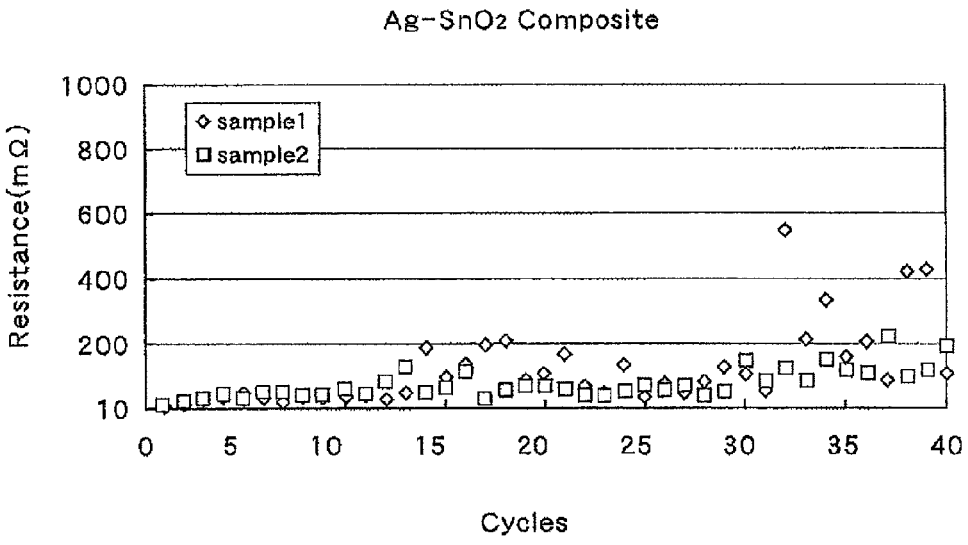
FIG. 31 is a graph representing a relationship between a cycle of the contact portion of the probe according to Ag—$SnO_2$ composite of the third embodiment and the resistance.
Figure 33A:
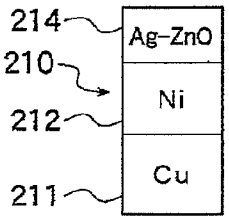
FIG. 33A, 33B, 33C, 33D, 33A', 33B', 33C', 33D' are schematic sectional views showing a contact portion of the contact pin according to a fourth embodiment of the present invention.
Figure 33B:
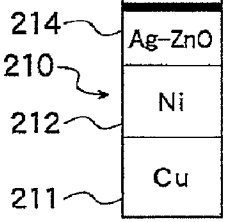
Figure 33C:
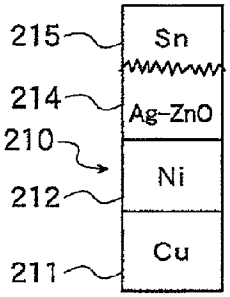
Figure 33D:
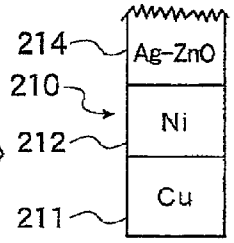
Figure 33A:
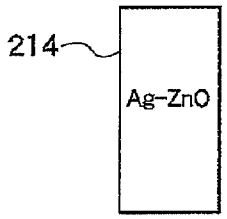
Figure 33B:
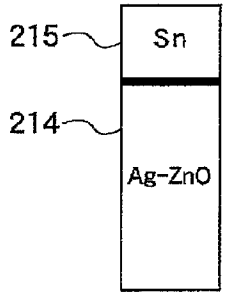
Figure 33C:
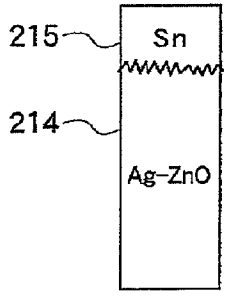
Figure 33D:
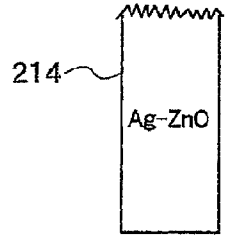

This will be confirmed by the graph of FIG. 31 representing a relationship between the cycle number and the electric resistance. This graph was prepared by measuring the electric resistance of the contact portion 121a at every cycle by using two samples of the probe 121, and as can be seen from this graph, it is found that even if the cycle number increases, the electric resistance does not increase.

Fourth Embodiment of the Invention

FIGS. 32A to 32D represent the fourth embodiment of the present invention.

An electric contact of this fourth embodiment is a contact pin to be disposed to an IC socket (socket for an electrical part) for a burn-in test, and the IC package as electrical part and a circuit board are electrically connected through this contact pin at the time of the burn-in test.

This IC package has a number of terminals on a lower surface of a rectangular package body, and the terminal is mainly made of Sn and includes no lead, so-called "lead-free solder".

The IC socket has a socket body mounted on the circuit board and a number of contact pins are arranged to the socket body.

The contact pin has a contact portion 210 contacting the terminal 215, and as shown in FIGS. 32A to 32D, the contact portion 210 to be contacted to a terminal 215 is composed of a base material 211 of copper (Cu), a Ni (nickel) plating layer 212 formed on the surface side of the base material 211, and a contact material 213 formed on the surface side of the Ni plating layer 212.

This contact material 213 is a material into which Sn contained in a solder is diffused, and the contact material 213 is selected from a material having a tensile strength higher than that of the lead-free solder, and being able to give a Sn-diffused alloy having a tensile strength higher than that of the lead-free solder.

As such contact material 213, there is used a material formed from a plating layer of Pd (palladium)-Ag (silver) alloy, a laminated layer of an Ag plating layer and a Pd—Ag alloy layer, a laminated layer of an Ag plating layer and a Pd plating layer, or a plating layer of Ag—Sn alloy.

The tensile strength of the Pd—Ag alloy as the contact material 213 is about 500 MPa. On the other hand, the strength of the solder is about 50 MPa, and a tensile strength of the Pd—Ag alloy in the case where the Sn is diffused in the alloy as the contact material 213 is higher than the tensile strength of the solder. Of course, the tensile strength of the laminated layer of Ag plating layer and Pd—Ag alloy layer, the laminated layer of Ag plating layer and Pd plating layer, or the plating layer of Ag—Sn alloy, and the tensile strength of an alloy of these materials and the Sn are both higher than the tensile strength of the solder.

Accordingly, although in the conventional technology, the electric resistance increased in an early stage, in this embodiment, the increasing of the electric resistance can be suppressed and the burn-in test can be appropriately performed by contacting such contact pin to the terminal 215 of the % IC package and repeatedly carrying out the burn-in test.

That is, in the conventional technology, since the outermost surface layer of the contact pin is an Au plating layer and the base layer is made of Ni, Au is dissolved into the terminal side, the Au plating layer is vanished and Ni of the base layer is exposed during the repeated burn-in test of the IC package having the lead-free solder terminal. Then, it is considered that the Ni forms an oxide film in air having large specific resistance, so that the electric resistance of the contact portion of the contact pin to the terminal is increased.

However, according to this embodiment, the contact portion 210 of the contact pin is made of the contact material 213 into which Sn contained in the solder is diffused, and accordingly, the Sn diffuses deeply inside the contact portion 210, and the Sn is hardly stored as an oxide on the surface of the contact portion 210.

Furthermore, since the tensile strength of the contact portion 210 of the contact pin is higher than that of the solder, at the time of taking out an electrical part, the contact material 213 is peeled off at a boundary surface between the contact portion 210 and the terminal of the electrical part. Therefore, a metal on the surface of the contact portion 210 on the electrical part terminal 215 side is not peeled off, and hence, the Ni plating layer 212 is not exposed and the low resistance can be maintained, so that even if the burn-in test is repeatedly carried out, the increasing of the electric resistance of the contact portion 210 in an early stage can be suppressed.

Fifth Embodiment of the Invention

FIGS. 33A to 33D' represent the fifth embodiment of the present invention.

A contact material 214 of this fifth embodiment differs from the contact material 213 of the fourth embodiment.

The contact material 214 of this fifth embodiment enables Sn contained in the solder to be diffused by adding an oxide or organic material to a material in which Sn contained in the solder is hardly diffused. Further, this contact material 214 has a tensile strength higher than that of the solder, and the tensile strength of an alloy in which Sn is diffused is also higher than that of the solder.

As this contact material 214, there is used a material made by adding zinc oxide, carbon or tin oxide to silver, for example.

A tensile strength of the material made by adding zinc oxide to silver as the contact material 214 is 150-300 MPa. On the other hand, the strength of the solder is about 50 MPa, and a tensile strength of an alloy, in the case where the Sn is diffused into the contact material 214, is higher than the tensile strength of the solder. Of course, the tensile strength of the other material in which C is added to Ag or that of a material in which $SnO_2$ is added to Ag, and that of an alloy of these materials and the Sn are higher than the tensile strength of the solder.

In this embodiment, by adding an oxide or organic material to a material into which Sn contained in the solder is hardly diffused, the contact portion 210 of the contact pin is made of the contact material 214 in which Sn contained in the solder is diffused. Therefore, the Sn is diffused deeply inside the contact portion 210 and the Sn is hardly stored as an oxide on the surface of the contact portion 210.

Furthermore, since the tensile strength of the contact portion 210 of the contact pin is higher than that of the solder, at the time of taking out an electrical part, the contact material 214 is peeled off at a boundary surface between the contact portion 210 and the terminal 215 of the electrical part. Therefore, a metal on the surface of the contact portion 210 on the electrical part terminal 215 side is not peeled off, and hence, the Ni plating layer 212 is not exposed and the low resistance can be maintained, so that even if the burn-in test is repeatedly carried out the increasing of the electric resistance of the contact portion 210 in an early stage can be suppressed.

Further, herein, there is no problem in function even if the Ni plating layer 212 does not exist. In addition, even if the Ni plating layer 212 and the Cu base material 212 do not exist and the contact portion 210 is made entirely of the contact material 214, there is also no problem in function (see FIGS. 33A, 33B', 33C' and 33D').

Hereunder, an evaluation test for confirming the effects of the present invention will be explained.

Herein, the probe 217 of the conventional Au plating and the probe 218 provided with the contact material 213 (Pd—Ag) of the contact portion of the present invention or the probe 219 provided with the contact material 214 (ZnO is added to Ag) were compared in terms of the electric resistance increasing tendency by carrying out the burn-in test.

(1) Test Content

A model test, not a mount test using an actual contact pin, using simple-shaped probes 217, 218 and 219 and solder specimen 220, was performed. This was done to get more accurate evaluation of characteristics of a material of the contact pin. That is, this is because that the contact in which the contact pin is mounted to a socket for an electrical part provides many unstable factors, and reliability in reproducibility of the test condition may include a problem.

The probes 217, 218 and 219 and solder specimen 220 used for the present model test have the following specifications.

(2) Au-Probe Specification (Conventional)

Phosphor bronze was used as the base material.

Figure 34B:
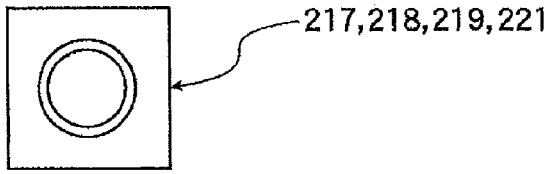
FIGS. 34A to 34C are views showing a probe for evaluation test.
Figure 34C:
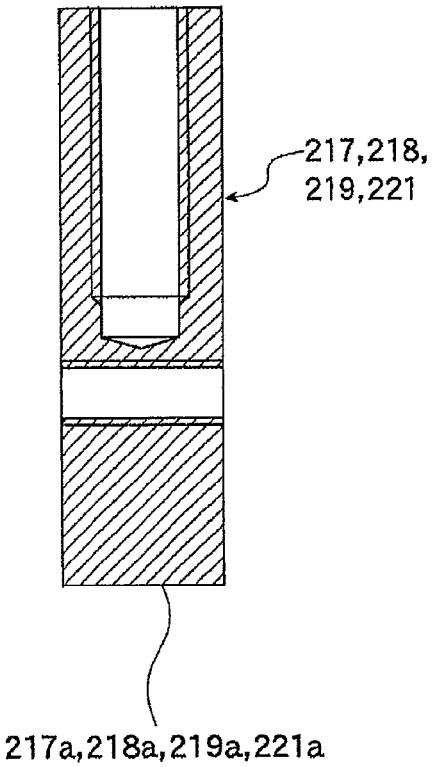
Figure 34A:
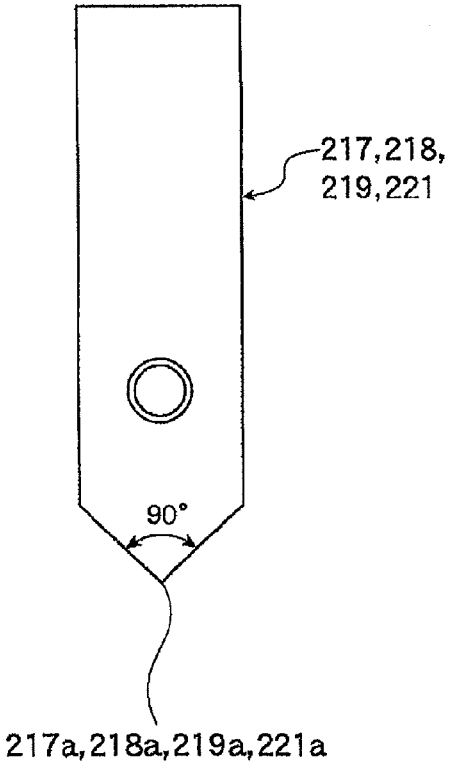

The probe 217 has the shape such that the contact portion 217a thereof has an angle of 90 degrees as shown in FIGS. 34A to 34C.

The quality control and manufacture of this contact portion 217a were such that the front end of the base material was ground by a grinding paper of #1200 roughness, and thereafter, was finished by using a grinding paper of #4000 roughness. A Ni plating was thereafter effected so as to have a thickness of 2-3 μm and the Au plating of 0.8 μm was then applied thereon.

(3) Pd—Ag Probe Specification

Phosphor bronze was used as the base material.

The probe 218 has the shape such that the contact portion 218a thereof has an angle of 90 degrees as shown in FIGS. 34A to 34C.

The quality control and manufacture of this contact portion 218a were such that the front end of the base material was ground by a grinding paper of #1200 roughness, and thereafter, was finished by using a grinding paper of #4000 roughness. A Ni plating was thereafter effected so as to have a thickness of 2-3 μm and the Pd—Ag plating of 2-3 μm thick was then applied thereon. The weight ratio of Pd to Ag was 6:4.

(4) Ag—ZnO Probe Specification

The Ag—ZnO was used entirely.

The probe 219 has the shape such that the contact portion 219a thereof has an angle of 90 degrees as shown in FIGS. 34A to 34C.

The quality control and manufacture of this contact portion 219a were such that the front end of the base material was ground by a grinding paper of #1200 roughness, and thereafter, was finished by using a grinding paper of #4000 roughness. The weight ratio of the Ag:ZnO was 9:1.

(5) Solder Specimen Specification

Glass epoxy material was used as the base material.

Figure 35A:
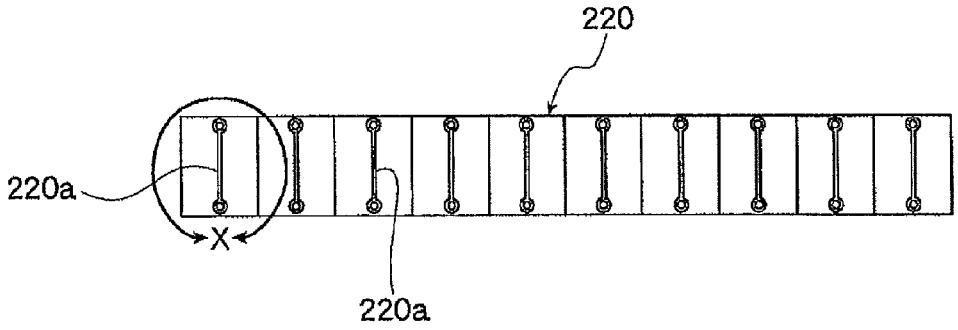
FIGS. 35A and 35B are views showing a solder specimen for the evaluation test.
Figure 35B:
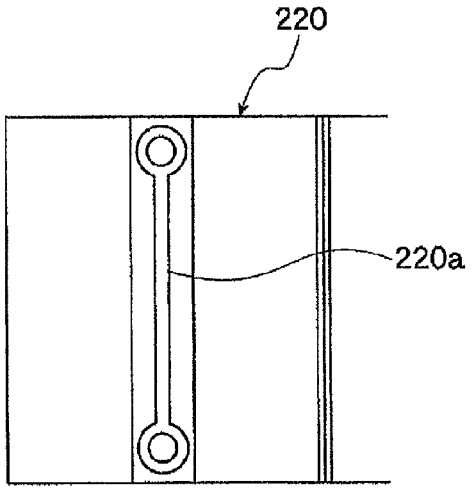

The solder specimen 220 was formed, as shown in FIGS. 35A and 35B, by printing Cu/NiAu to the glass epoxy substrate, screen-printing a lead-free solder paste (Sn—Ag—Cu (weight ratio: 96.5:3:0.5)) on the substrate and then having the same reflowed by the surface tension to thereby form the contact portion 120a.

(6) Measuring Method

Resistance measuring method: four terminal method

Test Conditions

Contact load: 15 g (managed by weight)

Ambient temperature: room temperature—150° C.

Electric current 80 mA

Test Cycle a) Contact the probe contact portions 217a, 218a and 219a to the solder specimen 220.

b) Measure the resistance of the probe contact portions 217a, 218a and 219a.

c) Heat the probes 217, 218 and 219 to a temperature of 150° C.

d) Keep the probes 217, 218 and 219 at 150° C. for 6 hours.

e) Lower the temperature to the room temperature.

f) Leave to stand for 30 minutes in a non-contact state.

g) Move the probe contact portions 217a, 218a and 219a to a new surface of the solder specimen 220.

Carry out 40 cycles of the above a) to 9) steps.

(7) Analysis of Sectional Area of Contact Potion

The above test cycles were carried out and the contact portions 217a, 218a and 219a of the respective probes 217, 218 and 219 were analyzed.

For the probe 217 of the Au plating, when the burn-in test was repeated, the Au was dissolved in the solder specimen 220 side, the Au plating layer was vanished, and a part of the Ni base layer was exposed.

Figure 36:
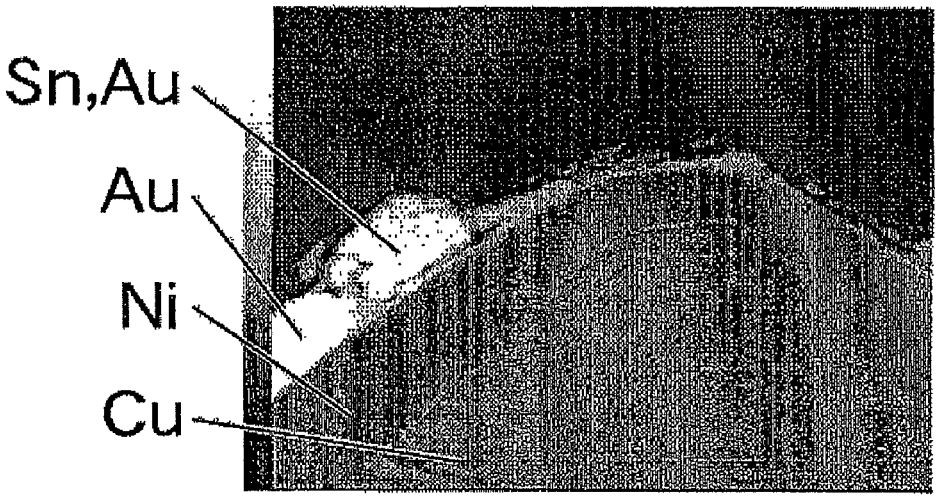
FIG. 36 is an enlarged sectional view showing a section analyzing result of a contact portion of a conventional probe.

That is, FIG. 36 shows a result of the section analysis (8000 times) after the transfer of the contact portion 217a of the probe 217, and from this FIG. 36, it is found that the Ni is exposed to air at the surface of the contact portion 217a.

This Ni forms an oxide film in air having large specific resistance after the exposure of the Ni, and because of this reason, it is considered that the contact resistance increases.

Figure 37:
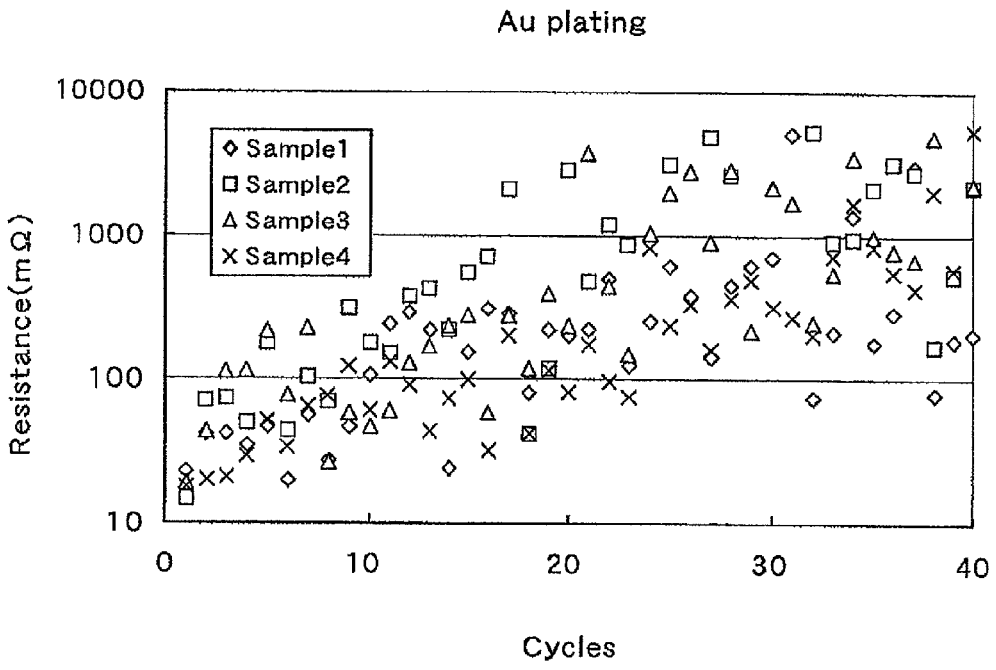
FIG. 37 is a graph representing a relationship between a cycle of the contact portion of the conventional probe and a resistance.

For the confirmation of this matter, FIG. 37 shows a graph representing a relationship between the cycle number and the electric resistance. This graph shows the measured result of the electric resistance of the contact portion 217a at every cycle using four samples of the probe 217, and from this graph, it will be found that as the cycle number increases, the electric resistance also increases.

On the other hand, in the probe 218 of the Pd—Ag plating according the fifth embodiment, it is considered that Sn in the solder specimen 220 is transferred to the probe 218 and diffused inside thereof so that the oxide layer of the various metals on the surface of the contact portion 218a is destroyed. In addition, the transfer of the substance caused between the contact portion 218a of the probe 218 and the contact portion 220a on the solder specimen 220 side is a transfer of the Sn from the contact portion 220a of the solder specimen 220 side to the contact portion 218a on the probe 218 side, so that the surface portion of the probe 218 is never vanished and even if the Ni exists as the base layer, the Ni is never exposed.

Figure 38:
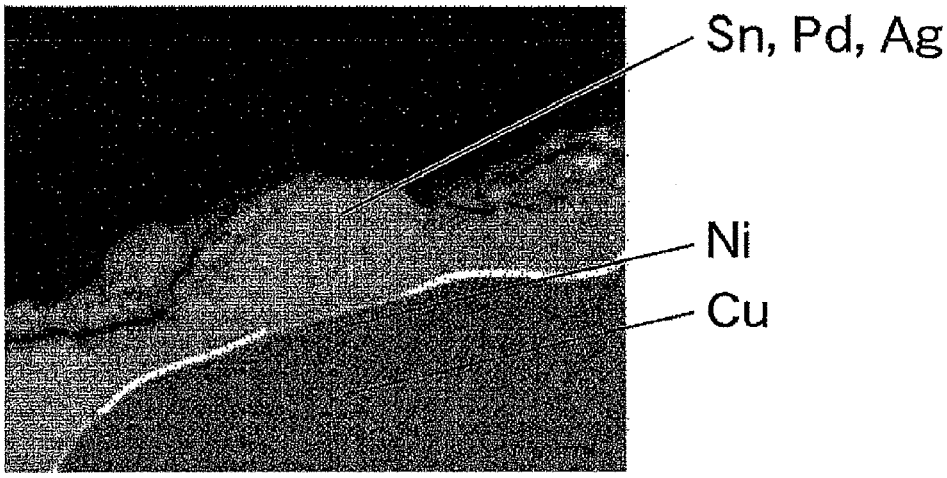
FIG. 38 is a sectional view, in an enlarged scale, representing a section analyzing result of a contact portion of a probe of a contact material of Pd—Ag alloy according to the fourth embodiment of the present invention.

That is, FIG. 38 shows a result of section analysis (8000 times) of the contact portion 218a of the probe 218 after the transfer. From this FIG. 38, it is found that the Sn is diffused inside.

Further, the strength of the contact material 213 of the Pd—Ag is higher than that of the solder, so that the metal on the surface of the contact portion 218a is not transferred to the solder specimen 220 side, and the Ni as the base layer is not hence exposed.

According to this fact, it is considered that the increasing of the contact resistance of the contact portion 218a is suppressed.

Figure 39:
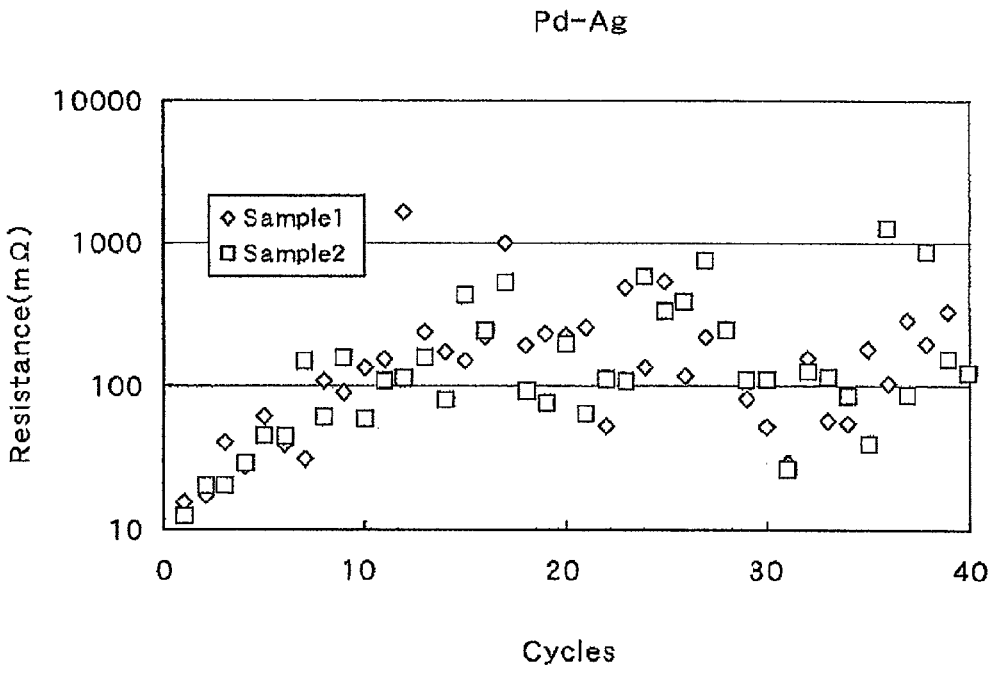
FIG. 39 is a graph representing a relationship between a cycle of the contact portion of the probe of the contact material of Pd—Ag alloy according to the fourth embodiment.

This is confirmed by the graph of FIG. 39 representing a relationship between the cycle numbers and the electric resistance. This graph was prepared by measuring the electric resistance of the contact portion 218a at every cycle by using two samples of the probe 218, and as can be seen from this graph, it is found that even if the cycle number increases, the electric resistance does not increase.

Furthermore, for the probe 219 of the material in which ZnO is added to Ag according to the fifth embodiment, it is considered that Sn of the solder specimen 220 is transferred to the probe 218 and diffused inside thereof, so that the oxide layer of the various metals on the surface of the contact portion 219a is destroyed. In addition, the transfer of the substance caused between the contact portion 219a on the probe 219 side and the contact portion 220a on the solder specimen 220 side is a transfer of Sn from the contact portion 220a of the solder specimen 220 side to the contact portion 219a on the probe 219 side, so that the surface portion of the probe 219 is never vanished and even if Ni exists as the base layer, the Ni is never exposed.

That is, FIGS. 40A to 40D show a result of section analysis (8000 times) of the contact portion 219a of the probe 219 after the transfer. FIG. 40A shows a component image, in FIG. 40B, thin color portion shows the Ag, in FIG. 40C, thin color portion shows ZnO, and in FIG. 40D, thin color portion shows Sn.

Accordingly, as shown in FIG. 40D, the Sn is diffused inside the contact portion 219a.

Further, in the case of a probe where Ag is only used as a material of the probe, the Sn is not diffused in the inside of the Ag, any alloy is not formed, and the Sn stored on the surface of the Ag is oxidized, thereby increasing the electric resistance.

From this fact, it is considered that the increasing in the electric resistance of the contact portion 219a is suppressed.

Figure 41:
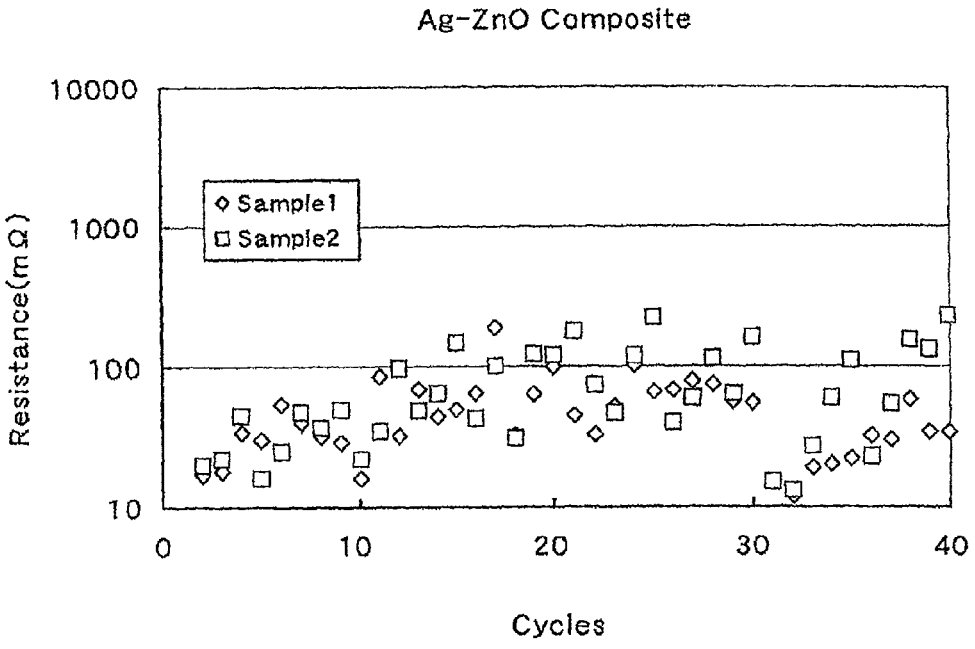
FIG. 41 is a graph representing a relationship between the cycle of a contact portion of the probe having the contact material which is a material made of an Ag added with ZnO and the resistance according to the fifth embodiment and an electric resistance.

As confirmation of the above matter, there is a graph of FIG. 41 showing a relationship between the cycle number and the electric resistance according to the measurement result. This graph shows the measurement result of the electric resistance of the contact portion 219a at every cycle using two samples of the probe 219, and in view of this graph, it is found that even if the cycle number increases, the electric resistance does not increase.

Further, in the above embodiments, there were described examples in which the contact pin as "electric contact portion" is applied to the IC socket, but the present invention is not limited to such examples and is applicable to other examples.

EXPLANATION OF REFERENCE NUMERAL

11—contact pin
12—base material
13—base layer
14—outermost surface layer
14a—Pd—Ag plating layer
14b—Pd plating layer
14c—Ag plating layer
118—probe of Ag—ZnO composite
119—probe of C composite
120—a solder specimen
121—of Ag—$SnO_2$ composite
210—contact portion
211—base material
212—Ni plating layer
213, 214—contact material
218—probe having contact material of Pd—Ag
219—probe having a contact material of Ag to which ZnO is added

The invention claimed is:

1. A socket for an electrical part, that is used for a burn-in test, comprising:

a socket body, comprising an accommodation portion in which an electric terminal of the electrical part is accommodated, the electric terminal comprising a film on a surface thereof, the film comprising Sn, the accommodation portion comprising an electric contact which contacts the electric terminal, the electric contact comprising:

an intermediate layer comprising Ni, and an outermost surface layer, on the intermediate layer, the outermost surface layer comprising Pd and Ag, the outermost surface layer being formed directly on the intermediate layer, and a weight ratio of the Ag in the outermost surface layer being larger than a weight ratio of the Pd in the outermost surface layer.

2. The socket for an electrical part according to claim 1, wherein the outermost surface layer of the electric contact includes a Pd—Ag plating layer.

3. The socket for an electrical part according to claim 1, wherein the outermost surface layer of the electric contact is a lamination of a Pd—Ag plating layer, and an Ag plating layer or a Pd plating layer.

4. The socket for an electrical part according to claim 1, wherein the outermost surface layer of the electric contact is a lamination of an Ag plating layer and a Pd plating layer.

5. The socket for an electrical part according to claim 1, wherein the outermost surface layer of the electric contact comprises Ag, Pd and another metal.

6. The socket for an electrical part according to claim 1, wherein

Sn included in a solder is diffused into the outermost surface layer, and the outermost surface layer has a tensile strength higher than a tensile strength of the solder, and an alloy containing both the outermost surface layer and the diffused Sn has a tensile strength higher than the tensile strength of the solder.

7. The socket for an electrical part according to claim 6, wherein the outermost surface layer is made of a lamination of a Pd—Ag alloy plating layer, a lamination of an Ag plating layer and a Pd—Ag alloy plating layer, or a lamination of the Ag plating layer and the Pd plating layer.

8. The socket for an electrical part according to claim 1, wherein the electric contact comprises a pin.

*9. The socket for an electrical part according to claim 5, wherein the outermost surface layer of the electric contact comprises Ag, Pd and Au.*

*10. The socket for an electrical part according to claim 9, wherein the outermost surface layer contains a lamination of an Ag layer, a Pd layer and an Au layer.*

*11. A socket for an electrical part, that is used for a burn-in test, comprising an electric contact electrically connected to a terminal which is provided for an electrical part and comprises a solder film containing Sn on a surface thereof, wherein:*

*the electric contact has a contact portion contacted to the terminal of the electrical part,*

*the contact portion comprises a lamination of layers into which the Sn of the solder film is diffused, and*

*the lamination of layers contains an intermediate layer and an outermost surface layer formed directly on the intermediate layer,*

*the outermost surface layer comprising*

*a Pd layer which contains Pd, and*

*an Ag layer which contains Ag and is formed on the Pd layer, and*

*a weight ratio of the Ag in the outermost surface layer being larger than a weight ratio of the Pd in the outermost surface layer.*

*12. The socket for an electrical part according to claim 11, wherein the Pd layer and the Ag layer are plating layers.*

*13. A socket for an electrical part, that is used for a burn-in test, comprising an electric contact electrically connected to a terminal which is provided for an electrical part and comprises a solder film containing Sn on a surface thereof, wherein:*

*the electric contact has a contact portion contacted to the terminal of the electrical part,*

*the contact portion comprises a lamination of layers into which the Sn of the solder film is diffused, and*

*the lamination of layers contains an intermediate layer and an outermost surface layer formed directly on the intermediate layer,*

*the outermost surface layer comprising*

*a Pd layer which contains Pd, and*

*a Pd—Ag layer which contains alloy of Pd and Ag and is formed on the Pd layer, and*

*a weight ratio of the Ag in the outermost surface layer being larger than a weight ratio of the Pd in the outermost surface layer.*

*14. The socket for an electrical part according to claim 13, wherein the Pd layer and the Pd—Ag layer are plating layers.*

*15. A socket for an electrical part, that is used for a burn-in test, comprising an electric contact electrically connected to a terminal which is provided for an electrical part and comprises a solder film containing Sn on a surface thereof, wherein:*

*the electric contact has a contact portion contacted to the terminal of the electrical part,*

*the contact portion comprises a lamination of layers into which the Sn of the solder film is diffused, and*

*the lamination of layers contains an intermediate layer and an outermost surface layer formed directly on the intermediate layer,*

*the outermost surface layer comprising*

*a Pd—Ag layer which contains alloy of Pd and Ag, and*

*an Ag layer which contains Ag and is formed on the Pd—Ag layer, and*

*a weight ratio of the Ag in the outermost surface layer being larger than a weight ratio of the Pd in the outermost surface layer.*

*16. The socket for an electrical part according to claim 15, wherein the Pd—Ag layer and the Ag layer are plating layers.*

*17. A socket for an electrical part, that is used for a burn-in test, comprising:*

*a socket body,*

*a accommodation portion which accommodates the electrical part,*

*an electric contact electrically connected to a terminal which is provided for an electrical part and comprises a solder film containing Sn on a surface thereof,*

*wherein:*

*the electric contact has a contact portion contacted to the terminal of the electrical part,*

*the contact portion comprises a lamination of layers into which the Sn of the solder film is diffused, and*

*the lamination of layers contains an intermediate layer and an outermost surface layer formed directly on the intermediate layer, and*

*the outermost surface layer comprising*

*a Pd layer which contains Pd, and*

*an Ag layer which contains Ag and is formed on the Pd layer, and*

*a weight ratio of the Ag in the outermost surface layer being larger than a weight ratio of the Pd in the outermost surface layer.*

*18. A socket for an electrical part, that is used for a burn-in test, comprising:*

*a socket body,*

*a accommodation portion which accommodates the electrical part,*

*an electric contact electrically connected to a terminal which is provided for an electrical part and comprises a solder film containing Sn on a surface thereof,*

*wherein:*

*the electric contact has a contact portion contacted to the terminal of the electrical part,*

*the contact portion comprises a lamination of layers into which the Sn of the solder film is diffused, and*

*the lamination of layers contains an intermediate layer and an outermost surface layer formed directly on the intermediate layer,*

*the outermost surface layer comprising*

*a Pd layer which contains Pd, and*

*a Pd—Ag layer which contains alloy of Pd and Ag and is formed on the Pd layer, and*

*a weight ratio of the Ag in the outermost surface layer being larger than a weight ratio of the Pd in the outermost surface layer.*

*19. A socket for an electrical part, that is used for a burn-in test, comprising:*

*a socket body,*

*a accommodation portion which accommodates the electrical part,*

*an electric contact electrically connected to a terminal which is provided for an electrical part and comprises a solder film containing Sn on a surface thereof,*

*wherein:*

*the electric contact has a contact portion contacted to the terminal of the electrical part,*

*the contact portion comprises a lamination of layers into which the Sn of the solder film is diffused, and*

*the lamination of layers contains an intermediate layer and an outermost surface layer formed directly on the intermediate layer,*

*the outermost surface layer comprising*

*a Pd—Ag layer which contains alloy of Pd and Ag, and*

*an Ag layer which contains Ag and is formed on the Pd—Ag layer, and*

*a weight ratio of the Ag in the outermost surface layer being larger than a weight ratio of the Pd in the outermost surface layer.*

* * * * *